(12) United States Patent
Asako et al.

(10) Patent No.: US 7,902,077 B2
(45) Date of Patent: Mar. 8, 2011

(54) SEMICONDUCTOR DEVICE MANUFACTURING METHOD THAT RECOVERS DAMAGE OF THE ETCHING TARGET WHILE SUPPLYING A PREDETERMINED RECOVERY GAS

(75) Inventors: Ryuichi Asako, Nirasaki (JP); Kaoru Maekawa, Nirasaki (JP); Yasushi Fujii, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 593 days.

(21) Appl. No.: 11/564,548

(22) Filed: Nov. 29, 2006

(65) Prior Publication Data

US 2007/0122752 A1 May 31, 2007

(30) Foreign Application Priority Data

Nov. 30, 2005 (JP) ................................ 2005-346854

(51) Int. Cl.
*H01L 21/302* (2006.01)
(52) U.S. Cl. ......... 438/706; 438/689; 438/719; 438/723; 438/745
(58) Field of Classification Search .................. 438/689, 438/706, 719, 723, 724, 725, 745, 753
See application file for complete search history.

(56) References Cited

U.S. PATENT DOCUMENTS

| 5,702,767 | A | 12/1997 | Peterson et al. | |
|---|---|---|---|---|
| 7,482,281 | B2 | 1/2009 | Fujii et al. | |
| 2004/0152296 | A1* | 8/2004 | Matz et al. | 438/623 |
| 2004/0209190 | A1 | 10/2004 | Mori et al. | |
| 2005/0191865 | A1* | 9/2005 | Jacobson et al. | 438/780 |
| 2005/0215072 | A1* | 9/2005 | Kevwitch et al. | 438/778 |
| 2005/0241673 | A1* | 11/2005 | Endo et al. | 134/1.3 |
| 2006/0102210 | A1* | 5/2006 | Chouno et al. | 134/148 |
| 2007/0105392 | A1* | 5/2007 | Joe | 438/725 |
| 2007/0138640 | A1* | 6/2007 | Chakrapani et al. | 257/758 |
| 2008/0166870 | A1* | 7/2008 | Huang et al. | 438/619 |

FOREIGN PATENT DOCUMENTS

| CN | 1166798 A | 12/1997 |
|---|---|---|
| CN | 1404624 A | 3/2003 |
| CN | 1405859 A | 3/2003 |
| CN | 1405859 A | 3/2003 |
| CN | 1502122 A | 6/2004 |
| JP | 2002-83869 | 3/2002 |
| WO | WO 02/01621 A2 | 1/2002 |

* cited by examiner

Primary Examiner — Nadine G Norton
Assistant Examiner — Maki A Angadi
(74) Attorney, Agent, or Firm — Oblon, Spivak, McClelland, Maier & Neustadt, L.L.P.

(57) ABSTRACT

A semiconductor device manufacturing method includes: forming an etching mask having a predetermined circuit pattern on a surface of an etching target film disposed on a semiconductor substrate; etching the etching target film through the etching mask to form a groove or hole in the etching target film; removing the etching mask by a process including at least a process using an ozone-containing gas; and recovering damage of the etching target film caused before or in said removing the etching mask, while supplying a predetermined recovery gas.

11 Claims, 21 Drawing Sheets

SEMICONDUCTOR DEVICE MANUFACTURING METHOD THAT RECOVERS DAMAGE OF THE ETCHING TARGET WHILE SUPPLYING A PREDETERMINED RECOVERY GAS

BACKGROUND OF THE INVENTION

1. Field of the Invention

The present invention relates to a method of manufacturing a semiconductor device by use of, e.g., a single damascene method or dual damascene method, and a substrate processing system used for manufacturing a semiconductor device.

2. Description of the Related Art

In semiconductor device manufacturing processes, a dual damascene method is frequently used for forming interconnection lines embedded in trenches and/or connection holes (for example, see Jpn. Pat. Appln. KOKAI Publication No. 2002-83869). FIGS. 1A to 1I are explanatory views schematically showing a method of forming a Cu interconnection line, using a conventional dual damascene method.

At first, for example, an interconnection layer 500, an inter-level insulating film 501, and an anti-reflective coating 502 are formed in this order on a substrate. Further, a first resist film 503 is formed on the surface of the multi-layer structure thus formed (FIG. 1A). Then, patterning of the first resist film 503 is performed by a photolithography technique to form a predetermined pattern (FIG. 1B). In this patterning step, the first resist film 503 is subjected to light exposure with a predetermined pattern, and the light-exposed portion is selectively removed by development. Subsequently, the anti-reflective coating 502 and inter-level insulating film 501 are etched by an etching process using the first resist film 503 as a mask. Consequently, a connection hole 504 is formed to extend from the surface of the multi-layer structure to the interconnection layer 500 (FIG. 1C).

Thereafter, for example, the first resist film 503, which is not necessary any more, is peeled and removed by an ashing process (FIG. 1D). Then, a new second resist film 505 for forming an interconnection groove is formed (FIG. 1E). Then, patterning of the second resist film 505 is performed by a photolithography technique (FIG. 1F). Then, the anti-reflective coating 502 and a part of the inter-level insulating film 501 are etched by an etching process using the second resist film 505 as a mask. Consequently, an interconnection groove 506 is formed to be connected to the connection hole 504 and wider than the connection hole 504 (FIG. 1G). Then, the second resist film 505, which is not necessary any more, is peeled and removed (FIG. 1H). Then, the connection hole 504 and interconnection groove 506 are filled with Cu material, so that a Cu interconnection line 507 is formed (FIG. 1I)

Incidentally, with a decrease in size of semiconductor devices, the parasitic capacitance of inter-level insulating films has become an important factor to improve the performance of interconnection lines. For this purpose, low dielectric constant materials (Low-k materials) are used as the material of inter-level insulating films. In general, materials including alkyl groups, such as methyl groups, as end groups are used as low dielectric constant materials (Low-k materials) for forming inter-level insulating films.

However, according to the conventional damascene process described above, when a resist film is peeled, the inter-level insulating film 501 made of a Low-k material is damaged. This damage increases the dielectric constant of the inter-level insulating film 501, and deteriorates some effects obtained by using the Low-k material.

In order to minimize such damage as far as possible, it has been proposed to perform high temperature ashing by use of He gas and $H_2$ gas for resist peeling, by A. Matsushita et al. "Low damage ashing using $H_2$/He plasma for porous ultra Low-k", Proceeding IITC 2003 pp 147-149. However, this technique is insufficient not only in the effect of suppressing damage but also in the effect of peeling resist, and thus is unpractical.

BRIEF SUMMARY OF THE INVENTION

An object of the present invention is to provide a semiconductor device manufacturing method to manufacture a semiconductor device excellent in electrical characteristics and reliability, and a substrate processing system to realize a manufacturing method of this kind.

Another object of the present invention is to provide a computer readable memory medium that stores a control program to execute a manufacturing method of this kind.

According to a first aspect of the present invention, there is provided a semiconductor device manufacturing method comprising: forming an etching mask having a predetermined circuit pattern on a surface of an etching target film disposed on a semiconductor substrate; etching the etching target film through the etching mask to form a groove or hole in the etching target film; removing the etching mask by a process including at least a process using an ozone-containing gas; and recovering damage of the etching target film caused before or in said removing the etching mask, while supplying a predetermined recovery gas.

In the manufacturing method according to the first aspect, said removing the etching mask may be performed by denaturing the etching mask by ozone and water vapor used as the process gas, and then processing the etching mask by purified water or a chemical liquid. Alternatively, said removing the etching mask may be performed by denaturing the etching mask by ozone used as the process gas, and then processing the etching mask by purified water or a chemical liquid.

The method may further comprise cleaning the semiconductor substrate after said removing the etching mask and before said recovering damage. Further, said recovering damage may be performed by a silylation process using a silylation gas as the recovery gas.

According to a second aspect of the present invention, there is provided a semiconductor device manufacturing method comprising: forming an etching mask having a predetermined circuit pattern on a surface of an etching target film disposed on a semiconductor substrate; etching the etching target film through the etching mask to form a groove or hole in the etching target film; removing the etching mask; and recovering damage of the etching target film caused before or in said removing the etching mask, while supplying a predetermined recovery gas, wherein said recovering damage comprises heating the semiconductor substrate before and/or after starting supply of the recovery gas.

In the manufacturing method according to the second aspect, said recovering damage may be performed by a silylation process using a silylation gas as the recovery gas. In this case, a temperature of 50 to 200° C. is preferably used for said heating before and/or after starting supply of the recovery gas. Further, said heating preferably comprises heating before and after starting supply of the recovery gas, such that a first temperature is used for said heating before starting supply of the recovery gas, and a second temperature higher than the first temperature is used for said heating after starting supply of the recovery gas.

According to a third aspect of the present invention, there is provided a semiconductor device manufacturing method comprising: forming an etching mask having a predetermined circuit pattern on a surface of an etching target film disposed on a semiconductor substrate; etching the etching target film by dry etching through the etching mask to form a groove or hole in the etching target film; removing the etching mask by a dry process subsequently to said etching; supplying moisture into a space accommodating the semiconductor substrate to apply moisture onto the semiconductor substrate after said removing the etching mask; heating the semiconductor substrate with moisture adsorbed thereon; and recovering damage of the etching target film caused before or in said removing the etching mask, while supplying a predetermined recovery gas after said heating.

In the manufacturing method according to the third aspect, said etching by dry etching to form a groove or hole in the etching target film, said removing the etching mask, and said recovering damage may be performed in one unit.

Said removing the etching mask may be performed by a dry ashing process using oxygen plasma. Alternatively, said removing the etching mask may be performed by a dry process using oxygen radicals.

Said recovering damage may comprise heating the substrate after starting supply of the recovery gas. In this case, it is preferable that a first temperature is used for said heating the semiconductor substrate with moisture adsorbed thereon, and a second temperature higher than the first temperature is used for said heating after starting supply of the recovery gas.

Said recovering damage may be performed by a silylation process using a silylation gas as the recovery gas. In this case, a temperature of 50 to 200° C is preferably used for heating the semiconductor substrate before starting supply of the silylation gas used as the recovery gas. Further, said applying moisture onto the semiconductor substrate may be performed by supplying atmospheric gas into the space accommodating the semiconductor substrate.

In the manufacturing method according to each of the first to third aspects, where a silylation process is performed as the recovery process, the silylation process is preferably performed while using a compound including silazane bonds (Si—N) in molecules as the recovery gas. The compound including silazane bonds in molecules is preferably selected from TMDS (1,1,3,3-Tetramethyldisilazane), TMSDMA (Dimethylaminotrimethylsilane), DMSDMA (Dimethylsilyldimethylamine), TMSPyrole (1-Trimethylsilylpyrole), BSTFA (N,O-Bis(trimethylsilyl)trifluoroacetamide), and BDMADMS (Bis(dimethylamino)dimethylsilane).

According to a fourth aspect of the present invention, there is provided a substrate processing system for processing a semiconductor substrate after using an etching apparatus to etch an etching target layer disposed on the semiconductor substrate through an etching mask having a predetermined pattern so as to form a groove or hole in the etching target film, the system comprising: an apparatus configured to denature the etching mask by a process gas containing ozone; a cleaning apparatus configured to remove the denatured etching mask by purified water or a chemical liquid; a recovering apparatus configured to perform a recovery process while supplying a predetermined recovery gas, to recover damage of the etching target film; and a control section configured to control the apparatuses, wherein the control section carries out control such that, after the etching mask is removed, the semiconductor substrate is transferred into the recovering apparatus, in which the recovery process is performed.

In the system according to the fourth aspect, the apparatus configured to denature the etching mask by a process gas containing ozone may use ozone and water vapor or ozone alone as the process gas.

The apparatus configured to denature the etching mask, the cleaning apparatus, and the recovering apparatus may be arranged in the same unit.

The control section may control the recovering apparatus to heat the semiconductor substrate before and/or after starting supply of the recovery gas. Further, the control section may carry out control to heat the semiconductor substrate at a first temperature before starting supply of the recovery gas, and to heat the semiconductor substrate at a second temperature higher than the first temperature after starting supply of the recovery gas, in the recovering apparatus.

The recovering apparatus may be configured to perform a silylation process using a silylation gas as the recovery gas. In this case, the control section preferably carries out control to use a temperature of 50 to 200° C. for said heating before and/or after starting supply of the recovery gas.

According to a fifth aspect of the present invention, there is provided a substrate processing system comprising: a dry etching apparatus configured to etch an etching target layer disposed on a semiconductor substrate by dry etching through an etching mask having a predetermined pattern so as to form a groove or hole in the etching target film; a dry ashing apparatus configured to remove the etching mask by dry ashing; a recovering apparatus configured to perform a recovery process for recovering damage of the etching target film, while supplying a predetermined recovery gas; a heating mechanism configured to heat the semiconductor substrate; a mechanism configured to apply moisture onto the semiconductor substrate; and a control section configured to control the apparatuses and the mechanisms, wherein the dry etching apparatus, the dry ashing apparatus, and the recovering apparatus are integratedly arranged in the same processing unit to perform processes in a vacuum atmosphere, and the control section carries out control such that, after the etching mask is removed by the dry ashing apparatus, moisture is applied onto the semiconductor substrate by the mechanism configured to apply moisture, then the semiconductor substrate is heated by the heating mechanism, and then the recovery process is performed by the recovering apparatus.

In the system according to the fifth aspect, the control section may carry out control to heat the semiconductor substrate after starting supply of the recovery gas, in the recovering apparatus. In this case, the control section preferably carries out control to heat the semiconductor substrate at a first temperature before starting supply of the recovery gas, and to heat the semiconductor substrate at a second temperature higher than the first temperature after starting supply of the recovery gas, in the recovering apparatus.

The recovering apparatus may be configured to perform a silylation process using a silylation gas as the recovery gas. In this case, the control section preferably carries out control to heat the semiconductor substrate at 50 to 200° C. before starting supply of the silylation gas as the recovery gas.

The control section preferably carries out control to heat the semiconductor substrate at 50 to 200° C. after starting supply of the silylation gas as the recovery gas, in the recovering apparatus. In this case, the control section preferably carries out control to heat the semiconductor substrate at a first temperature before starting supply of the silylation gas, and to heat the semiconductor substrate at a second temperature higher than the first temperature after starting supply of the silylation gas, in the recovering apparatus.

The mechanism configured to apply moisture onto the semiconductor substrate may comprise an atmospheric gas supply portion disposed in the processing unit.

According to a sixth aspect of the present invention, there is provided a computer readable memory medium that stores a control program for execution on a computer to control a substrate processing system for processing a substrate, wherein the control program, when executed, causes the computer to control the substrate processing system to conduct a semiconductor device manufacturing method comprising: forming an etching mask having a predetermined circuit pattern on a surface of an etching target film disposed on a semiconductor substrate; etching the etching target film through the etching mask to form a groove or hole in the etching target film; removing the etching mask by a process including at least a process using an ozone-containing gas; and recovering damage of the etching target film caused before or in said removing the etching mask, while supplying a predetermined recovery gas.

According to a seventh aspect of the present invention, there is provided a computer readable memory medium that stores a control program for execution on a computer to control a substrate processing system for processing a substrate, wherein the control program, when executed, causes the computer to control the substrate processing system to conduct a semiconductor device manufacturing method comprising: forming an etching mask having a predetermined circuit pattern on a surface of an etching target film disposed on a semiconductor substrate; etching the etching target film through the etching mask to form a groove or hole in the etching target film; removing the etching mask; and recovering damage of the etching target film caused before or in said removing the etching mask, while supplying a predetermined recovery gas, wherein said recovering damage comprises heating the semiconductor substrate before and/or after starting supply of the recovery gas.

According to an eighth aspect of the present invention, there is provided a computer readable memory medium that stores a control program for execution on a computer to control a substrate processing system for processing a substrate, wherein the control program, when executed, causes the computer to control the substrate processing system to conduct a semiconductor device manufacturing method comprising: forming an etching mask having a predetermined circuit pattern on a surface of an etching target film disposed on a semiconductor substrate; etching the etching target film by dry etching through the etching mask to form a groove or hole in the etching target film; removing the etching mask by a dry process subsequently to said etching; supplying moisture into a space accommodating the semiconductor substrate to apply moisture onto the semiconductor substrate after said removing the etching mask; heating the semiconductor substrate with moisture adsorbed thereon; and recovering damage of the etching target film caused before or in said removing the etching mask, while supplying a predetermined recovery gas after said heating.

According to the present invention, a method may be performed, as follows. Specifically, an etching target film disposed on a semiconductor substrate is etched through an etching mask to form an interconnection groove or connection hole. Then, the etching mask is removed by a process including a process using a process gas containing ozone. Specifically, at this time, the etching mask is denatured by ozone and water vapor used as a process gas, and then is processed by purified water or a chemical liquid. Alternatively, the etching mask is denatured by ozone used as a process gas, and then is processed by purified water or a chemical liquid. Thereafter, a recovery process using a process gas is performed by, e.g., a silylation process. Consequently, the etching mask can be removed at a practical rate, and then the damage of the etching target film caused in removing the etching mask can be sufficiently recovered. It follows that a semiconductor device can be manufactured to have improved electrical characteristics and reliability.

Further, according to the present invention, a method may be performed, as follows. Specifically, an etching target film disposed on a semiconductor substrate is etched through an etching mask to form an interconnection groove or connection hole. Then, the etching mask is removed, and then a recovery process using a recovery gas is performed by, e.g., a silylation process. At this time, the semiconductor substrate is heated before and/or after starting supply of the recovery gas. Consequently, the effect of the recovery process is enhanced, so that the damage of the etching target film caused in removing the etching mask can be sufficiently recovered. It follows that a semiconductor device can be manufactured to have improved electrical characteristics and reliability,

DETAILED DESCRIPTION OF THE INVENTION

Embodiments of the present invention will now be described with reference to the accompanying drawings. Hereinafter, the present invention is exemplified by a case where a semiconductor device is manufactured by a single damascene method and a case where a semiconductor device is manufactured by a dual damascene method.

Figure 1A:
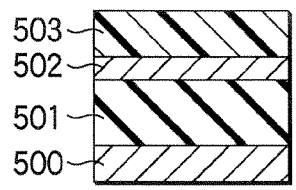
FIGS. 1A to 1I are sectional views showing steps of a semiconductor device manufacturing process using a conventional dual damascene method.
Figure 1B:
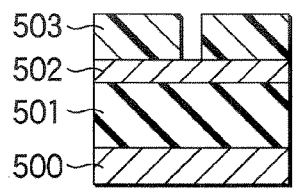
Figure 1C:
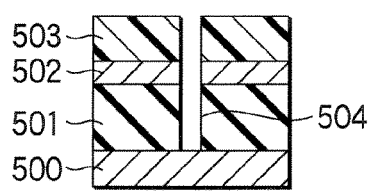
Figure 1D:
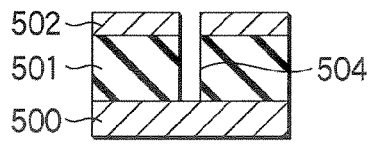
Figure 1E:
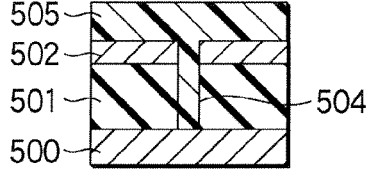
Figure 1F:
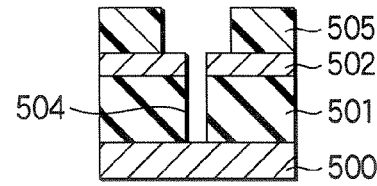
Figure 1G:
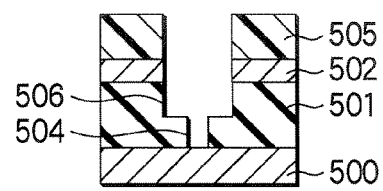
Figure 1H:
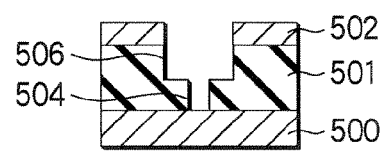
Figure 1I:
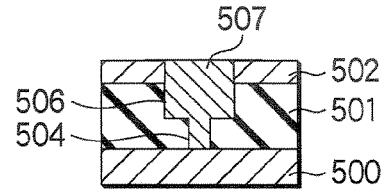
Figure 2:
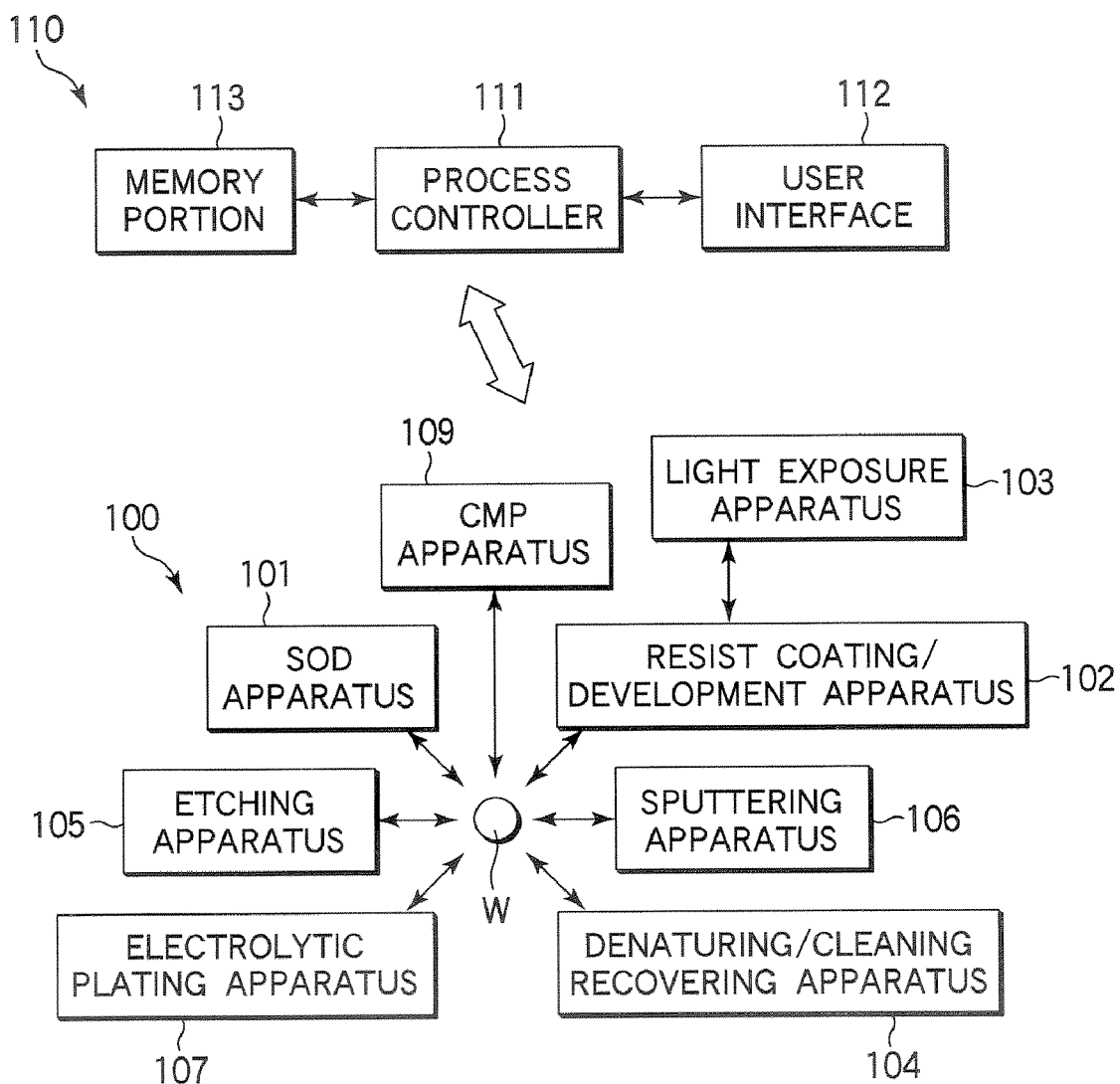
FIG. 2 is an explanatory view schematically showing the arrangement of a semiconductor device manufacturing system used for a semiconductor device manufacturing process according to a first embodiment of the present invention.

FIG. 2 is an explanatory view schematically showing the arrangement of a semiconductor device manufacturing system used for a semiconductor device manufacturing process according to a first embodiment of the present invention. This semiconductor device manufacturing system includes a process section 100 and a main control section 110. The process section 100 includes an SOD (Spin On Dielectric) apparatus 101, a resist coating/development apparatus 102, a light exposure apparatus 103, a denaturing/cleaning/recovering apparatus 104 for performing resist denaturing, cleaning, and recovery processes, an etching apparatus 105, a sputtering apparatus 106 used as a PVD apparatus, an electrolytic plating apparatus 107, and a CMP apparatus 109 used as a polishing apparatus. The main control section 110 includes a process controller 111, a user interface 112, and a memory portion 113. The SOD apparatus 101, sputtering apparatus 106, and electrolytic plating apparatus 107 of the process section 100 are film formation apparatuses. As a method for transferring a wafer W between apparatuses in the process section 100, a transfer method by an operator and/or a transfer method by a transfer unit (not shown) are used.

Each of the apparatuses in the process section 100 is connected to and controlled by the process controller 111 having a CPU. The process controller 111 is connected to the user interface 112, which includes, e.g., a keyboard and a display, wherein the keyboard is used for a process operator to input commands for operating the apparatuses in the process section 100, and the display is used for showing visualized images of the operational status of the apparatuses in the process section 100. Further, the process controller 111 is connected to the memory portion 113, which stores recipes with control programs and process condition data recorded therein, for realizing various processes performed in the process section 100 under the control of the process controller 111.

A required recipe is retrieved from the memory portion 113 and executed by the process controller 111 in accordance with an instruction or the like input through the user interface 112. Consequently, each of various predetermined processes is performed in the process section 100 under the control of the process controller 111. Recipes may be stored in a readable memory medium, such as a CD-ROM, hard disk, flexible disk, or nonvolatile memory. Further, recipes may be utilized on-line, while it is transmitted among the respective apparatuses in the process section 100, or transmitted from an external apparatus through, e.g., a dedicated line, as needed.

The main control section 110 may be arranged to control all the apparatuses, or may be arranged to perform only global control, while each of the apparatuses or each predetermined set of apparatuses is provided with and controlled by its own subordinate control section.

The SOD apparatus 101 is used to apply a chemical liquid onto a wafer W to form an inter-level insulating film formed of, e.g., a Low-k film, or an etching stopper film by a spin coating method. Although the structure of the SOD apparatus 101 is not shown in detail, the SOD apparatus 101 includes a spin coater unit and a heat processing unit to perform a heat process on a wafer W with a coating film formed thereon. In the case of a wafer processing system, a CVD apparatus may be used to form an insulating film on a wafer W by a chemical vapor deposition (CVD) method, in place of the SOD apparatus 101.

The resist coating/development apparatus 102 is used to form a resist film used as an etching mask, and an anti-reflective coating. Although the resist coating/development apparatus 102 is not shown in detail, the resist coating/development apparatus 102 includes a resist coating unit, a BARC coating unit, a sacrificial film coating unit, a developing unit, and thermal processing units. The resist coating unit is arranged to apply a resist liquid onto a wafer W to form a resist film by spin coating. The BARC coating unit is arranged to apply an anti-reflective coating (BARC) onto a wafer W. The sacrificial film coating unit is arranged to apply a sacrificial film onto a wafer W. The developing unit is arranged to perform a development process on a resist film which has been subjected to light exposure with a predetermined pattern in the light exposure apparatus 103. The thermal processing units are arranged to respectively perform thermal processes on a wafer W with a resist film formed thereon, a wafer W treated by a light exposure process, and a wafer W treated by a development process. The light exposure apparatus 103 is used to subject a wafer W with a resist film formed thereon to light exposure with a predetermined circuit pattern.

As described later in detail, the denaturing/cleaning/recovering apparatus 104 is arranged to perform a denaturing process of a resist film or the like after an etching process, a cleaning and removing process of the resist film or the like, using purified water or a chemical liquid, after the denaturing process, and a recovery process of an inter-level insulating film for damage caused in removing the resist film.

The etching apparatus 105 is arranged to perform an etching process on an inter-level insulating film or the like formed on a wafer W. The etching process may be of a type using plasma or a type using a chemical liquid.

The sputtering apparatus 106 is used to form, e.g., each of an anti-diffusion film and a Cu seed layer. The electrolytic plating apparatus 107 is arranged to embed Cu in a groove having a Cu seed layer formed therein to form a groove interconnection line. The CMP apparatus 109 is arranged to perform a planarization process on a surface of a groove interconnection line filled with Cu, and so forth.

Figure 3:
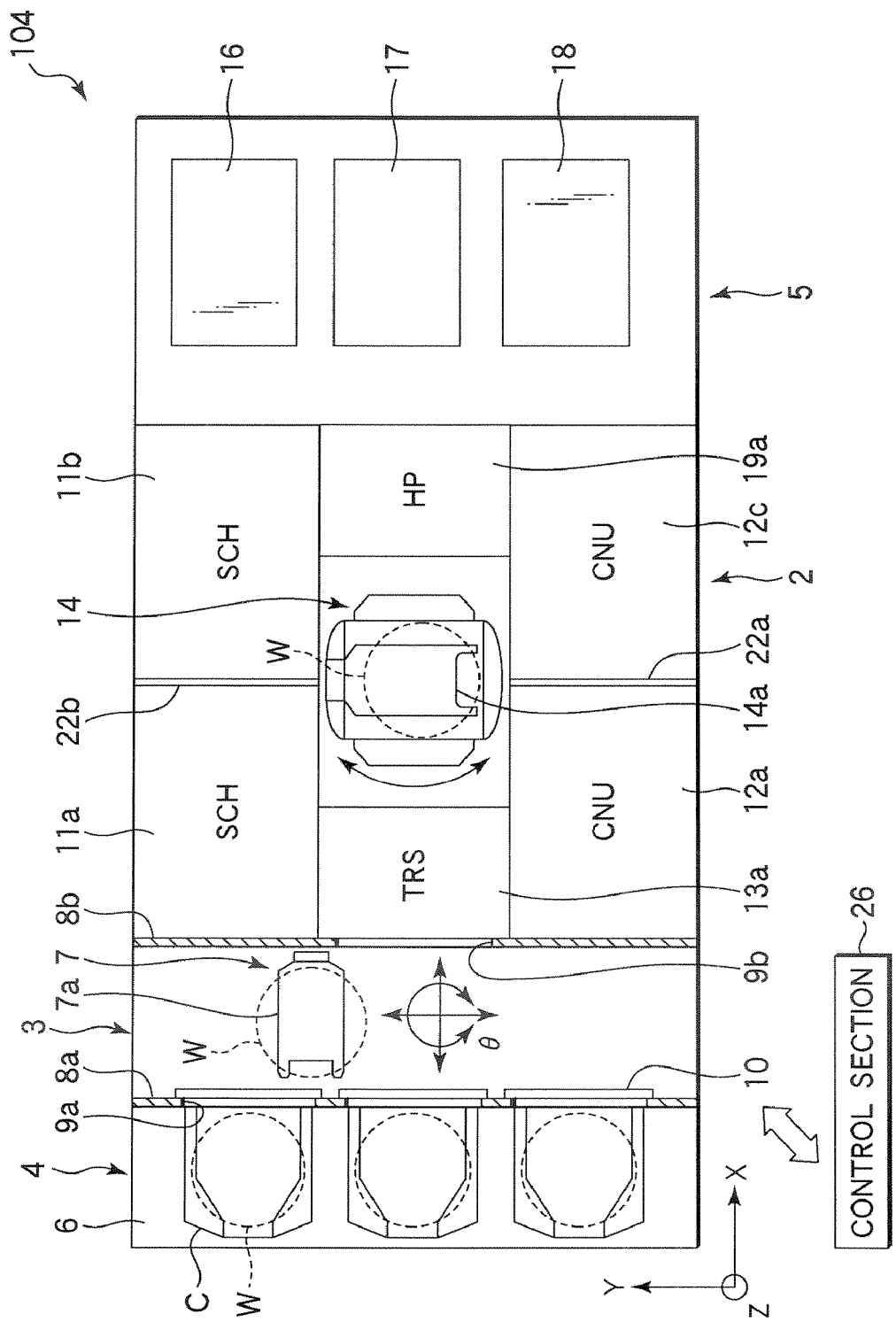
FIG. 3 is a plan view schematically showing the structure of a denaturing/cleaning/recovering apparatus used in the semiconductor device manufacturing system shown in FIG. 2.
Figure 4:
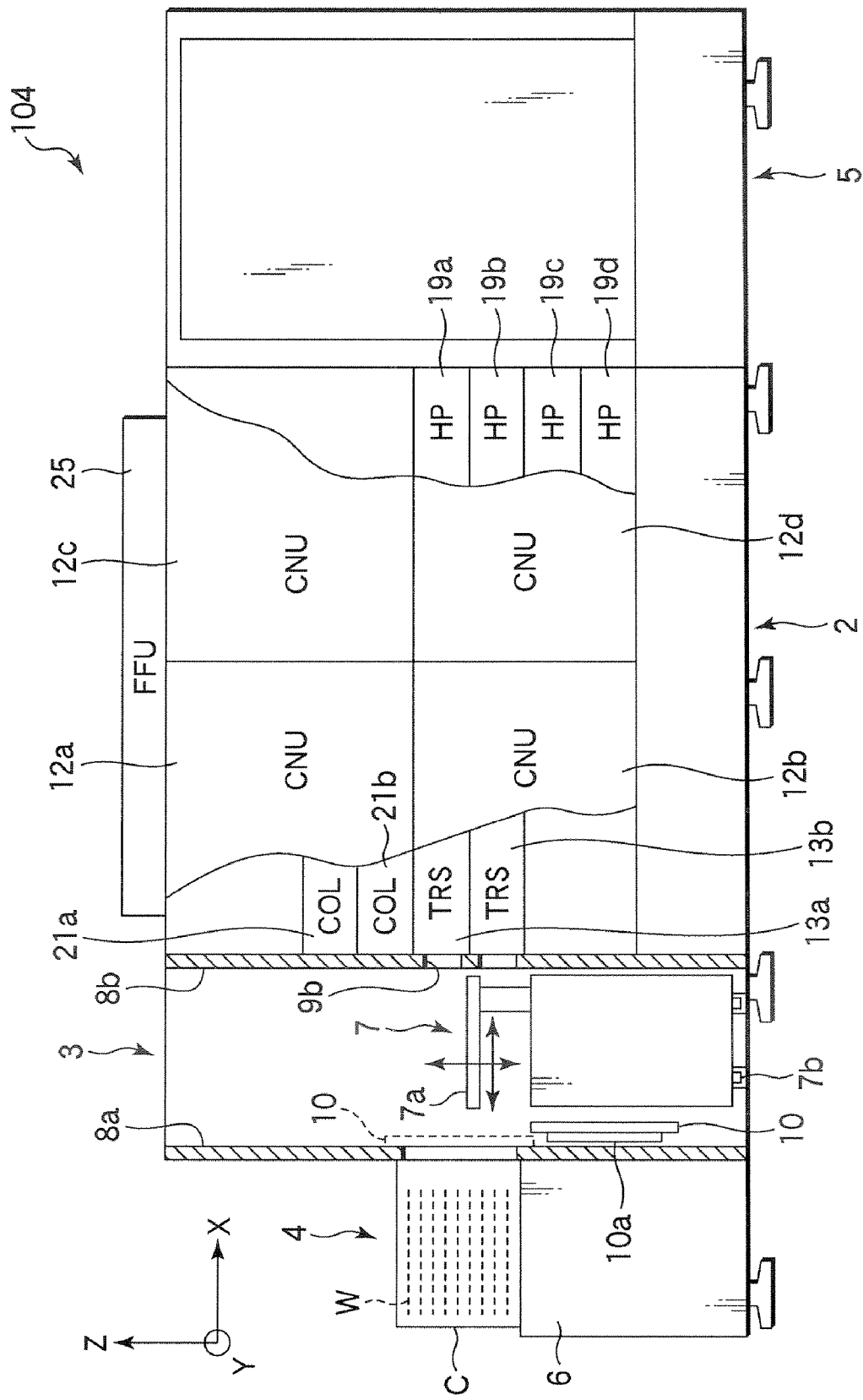
FIG. 4 is a front view schematically showing the structure of the denaturing/cleaning/recovering apparatus shown in FIG. 3.
Figure 5:
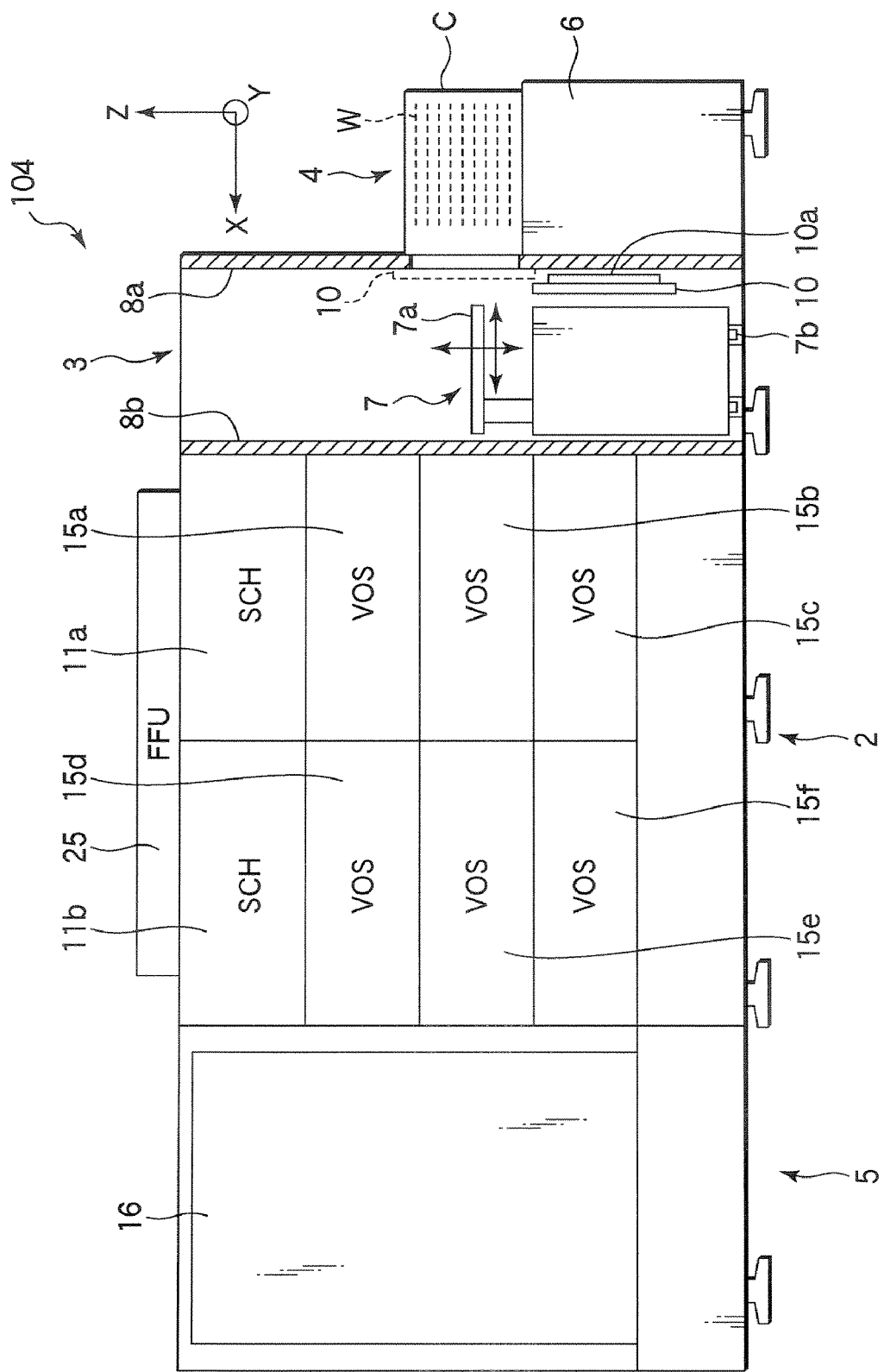
FIG. 5 is a back view schematically showing the structure of the denaturing/cleaning/recovering apparatus shown in FIG. 3.

Next, a detailed explanation will be given of the denaturing/cleaning/recovering apparatus 104 which plays an important part of this embodiment. FIGS. 3, 4, and 5 are a plan view, a front view, and a back view, respectively, schematically showing the denaturing/cleaning/recovering apparatus 104. The denaturing/cleaning/recovering apparatus 104 includes a carrier station 4, a process station 2, a transfer station 3, and a chemical station 5. The carrier station 4 is arranged such that carriers each storing wafers W are sequentially transferred from other processing apparatuses onto the carrier station 4. The carrier station 4 is also arranged such that carriers each storing wafers W processed in the denaturing/cleaning/recovering apparatus 104 are transferred from the carrier station 4 to processing apparatuses for subsequent processes. The process station 2 includes a plurality of processing units arranged to respectively perform a cleaning process, a denaturing process, and a recovery process. The transfer station 3 is arranged to transfer a wafer W between the process station 2 and carrier station 4. The chemical station 5 is arranged to perform manufacture, preparation, and storage of a chemical liquid, purified water, gas, and so forth to be used in the process station 2. The denaturing/cleaning/recovering apparatus 104 further includes a control section 26 for controlling the respective components thereof.

Each carrier C contains therein wafers W essentially in a horizontal state at regular intervals in the vertical direction (Z-direction). The wafers W are transferred to and from the carrier C through one side of the carrier C, which is opened/closed by a lid 10a (which is not shown in FIG. 3, but shown in FIGS. 4 and 5 in a detached state).

As shown in FIG. 3, the carrier station 4 has a table 6 on which carriers C can be placed at three positions arrayed in a Y-direction defined in FIG. 3. Each carrier C is placed on the table 6 such that the side provided with the lid 10a faces a partition wall 8a between the carrier station 4 and transfer station 3. The partition wall 8a has window portions 9a formed therein at positions corresponding to the mount positions for carriers C. Each of the window portions 9a is provided with a shutter 10 on the transfer station 3 side to open/close the window portion 9a. This shutter 10 includes holding means (not shown) for holding the lid 10a of a carrier C, so that the holding means can hold the lid 11a and withdraw it into the transfer station 3, as shown in FIGS. 4 and 5.

The transfer station 3 is provided with a wafer transfer unit 7 disposed therein, which has a wafer transfer pick 7a for holding a wafer W. The wafer transfer unit 7 is movable in the Y-direction along guides 7b (see FIGS. 4 and 5) extending on the floor of the transfer station 3 in the Y-direction. The wafer transfer pick 7a is slidable in an X-direction, movable up and down in the Z-direction, and rotatable in the X-Y plane (θ rotation).

With the arrangement described above, the wafer transfer pick 7a can access any one of the carriers C placed on the table 6, in a state where the shutters 10 are retreated to allow the interior of the carriers C to communicate with the transfer station 3 through the window portions 9a. Accordingly, the wafer transfer pick 7a can transfer a wafer W from any height position in each of the carriers C, and can transfer a wafer W onto any height position in each of the carriers C.

The process station 2 includes two wafer mount units (TRS) 13a and 13b on the transfer station 3 side. For example, the wafer mount unit (TRS) 13b is used to place a wafer W when the wafer W is transferred from the transfer station 3 to the process station 2. The wafer mount unit (TRS) 13a is used to place a wafer W when the wafer W is returned to the transfer station 3 after it is subjected to a predetermined process in the process station 2.

On the rear side of the process station 2, there are denaturing units (VOS) 15a to 15f arranged to process an anti-reflective coating and/or a resist mask remaining after an etching process, by a process gas containing ozone ($O_3$), such as a mixture gas of ozone and water vapor or ozone alone, so as to denature them to be soluble in purified water or a predetermined chemical liquid. In the denaturing units (VOS) 15a to 15f, the resist film used for the etching process only changes the chemical property to be soluble in purified water or a predetermined chemical liquid, while it maintains the shape.

Silylation units (SCH) 11a and 11b are disposed on the denaturing units (VOS) 15a and 15d, and are arranged to perform a silylation process as a recovery process to recover damage of an inter-level insulating film caused in removing a resist film by the denaturing process and cleaning process.

On the front side of the process station 2, there are cleaning units (CNU) 12a to 12d arranged to perform a chemical liquid process or water washing process on a wafer W treated by the denaturing units (VOS) 15a to 15f, so as to remove a denatured resist film or to perform a cleaning process after the removal.

In the process station 2, four hot plate units (HP) 19a to 19d are stacked at a position opposite to the wafer mount units (TRS) 13a and 13b with a main wafer transfer unit 14 interposed therebetween, and are arranged to heat and dry a wafer W treated by the cleaning units (CNU) 12a to 12d. Further, cooling plate units (COL) 21a and 21b are stacked on the wafer mount unit (TRS) 13a, and are arranged to cool a wafer W treated by the heat and dry process. The wafer mount unit (TRS) 13b may be arranged as a cooling plate unit. A fan and filter unit (FFU) 25 is disposed at the top of the process station 2, and is arranged to send clean air into the process station 2.

The main wafer transfer unit 14 is disposed essentially at the center of the process station 2, and is arranged to transfer a wafer W within the process station 2. The main wafer transfer unit 14 has a wafer transfer arm 14a for transferring a wafer W. The main wafer transfer unit 14 is rotatable about a Z-axis. Further, the wafer transfer arm 14a is movable back and forth in a horizontal direction, and movable up and down in the Z-direction. With this arrangement, the main wafer transfer unit 14 can access the respective units disposed in the process station 2 to transfer a wafer W between the units, without moving itself in the X-direct ion.

The chemical station 5 includes a process gas supply portion 16, a cleaning liquid supply portion 17, and a silylation agent supply portion 18. The process gas supply portion 16 is arranged to supply ozone, water vapor, and so forth as process gases to the denaturing units (VOS) 15a to 15f disposed in the process station 2. The cleaning liquid supply portion 17 is arranged to supply a cleaning liquid to the cleaning units (CNU) 12a to 12d. The silylation agent supply portion 18 is arranged to supply a silylation agent, a carrier gas, and so forth to the silylation units (SCH) 11a and 11b.

Figure 6:
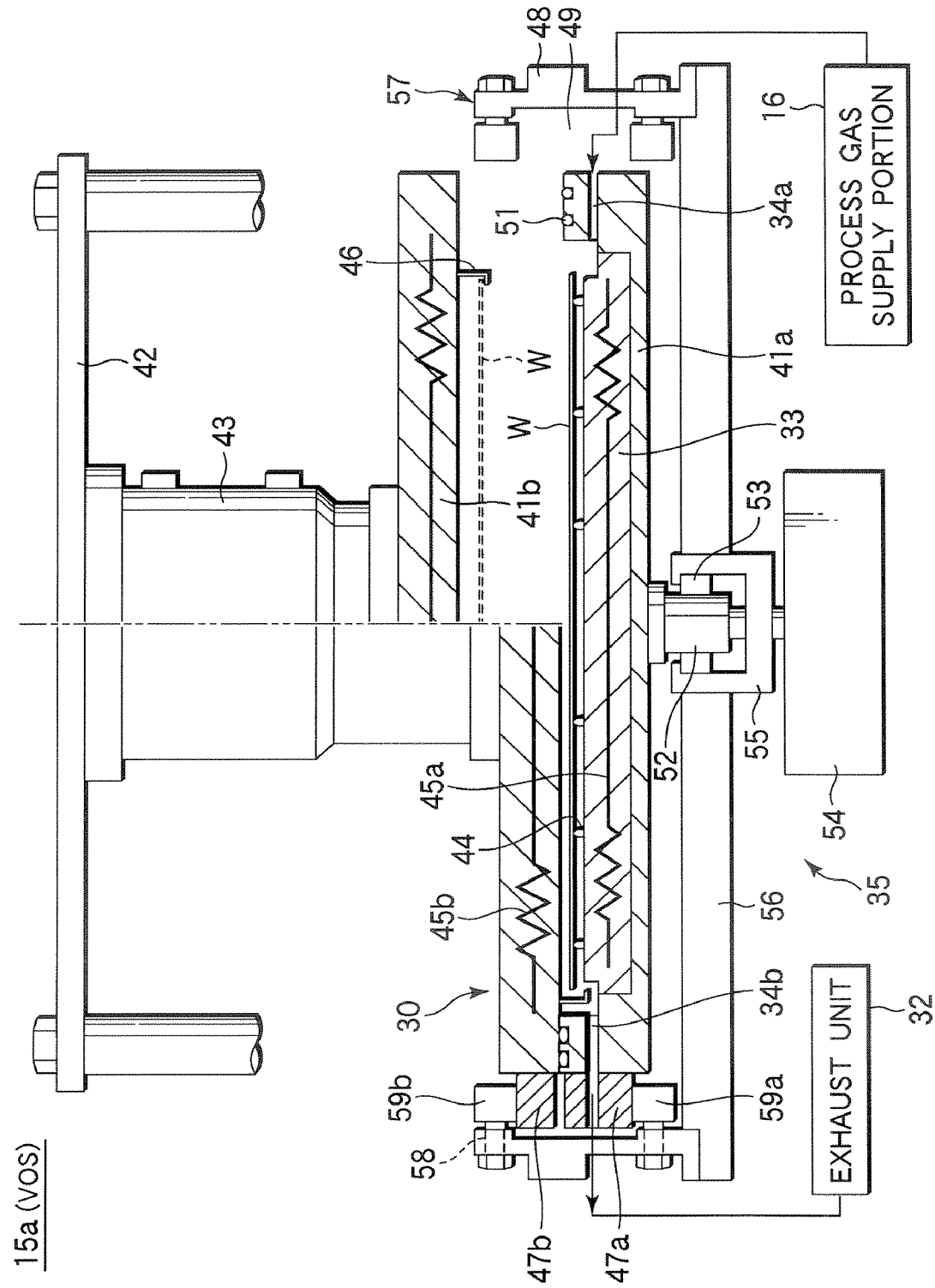
FIG. 6 is a sectional view schematically showing a denaturing unit disposed in the denaturing/cleaning/recovering apparatus.

Next, a detailed explanation will be given of the structure of the denaturing unit (VOS) 15a with reference to the schematic sectional view shown in FIG. 6. This denaturing unit (VOS) 15a includes an airtight chamber 30 for accommodating a wafer W. The chamber 30 is formed of a stationary lower container 41a, and a lid 41b that covers the top face of the lower container 41a. The lid 41b is movable up and down by a cylinder 43 fixed to a frame 42 of the film denaturing unit (VOS) 15a. FIG. 6 shows both of a state where the lid 41b is in close contact with the lower container 41a, and a state where the lid 41b is retreated above the lower container 41a.

The lower container 41a is provided with an O-ring 51 disposed on the top face of a raised portion at the rim. When the lid 41b is moved down by the cylinder 43, the rim of the bottom face of the lid 41b comes into contact with the top face of the raised portion at the rim of the lower container 41a and presses the O-ring 51 to form an airtight process space in the chamber 30.

The lower container 41a includes a stage 33 for placing a wafer W thereon. The stage 33 is provided with proximity pins 44 at a plurality of positions to support the wafer W.

The stage 33 includes a heater 45a built therein, and the lid 41b includes a heater 45b built therein, so that each of the stage 33 and lid 41b is maintained at a predetermined temperature. Consequently, the temperature of a wafer W can be kept constant.

The lid 41b has hook members 46 at, e.g., three positions (only two of them are shown in FIG. 6) on the bottom face to hold a wafer W. The wafer W is transferred to and from the hook members 46 by the wafer transfer arm 14a. When the lid 41b is moved down while a wafer W is supported by the hook members 46, the wafer W is transferred onto the proximity pins 44 provided on the stage 33, on the way.

The lower container 41a has a gas feed port 34a for supplying a process gas into the chamber 30, and a gas exhaust port 34b for exhausting the process gas out of the chamber 30. The gas feed port 34a is connected to the process gas supply portion 16, and the gas exhaust port 34b is connected to an exhaust unit 32. Through the process gas supply portion 16, a mixture gas of ozone and water vapor is supplied or ozone is solely supplied while water vapor is stopped. Further, $N_2$ gas can be further supplied as a dilution gas through the process gas supply portion 16.

When a wafer W is processed by a process gas, the pressure inside the chamber 30 is preferably maintained at a constant positive pressure. For this purpose, the lower container 41a and lid 41b is supplied with not only a pressing force by the cylinder 43, but also a clamping force by a lock mechanism 35 through projecting portions 47a and 47b respectively disposed on end sides of the lower container 41a and lid 41b.

The lock mechanism 35 includes a support shaft 52, a rotary tube 55 rotatable by a rotator unit 54, a circular plate 56 fixed to the rotary tube 55, and pinching devices 57 disposed at the rim of the circular plate 56. Each of the pinching devices 57 includes press rollers 59a and 59b and a roller holding member 48 which holds rotary shafts 58.

The projecting portions 47a and 47b are equidistantly disposed at four positions, between which gap portions 49 are defined. The projecting portions 47a and 47b of each set are disposed at positions overlapping with each other. When the pinching devices 57 are positioned in the gap portions 49, the lid 41b can be freely moved up and down.

When the circular plate 56 is rotated along with the rotary tube 55 by a predetermined angle, the press rollers 59b are stopped at the top faces of the projecting portions 47b, while the press rollers 59a are stopped under the projecting portions 47a. The other denaturing units have exactly the same structure.

Next, a detailed explanation will be given of the structure of the silylation unit (SCH) 11a with reference to the schematic sectional view shown in FIG. 7. The silylation unit (SCH) 11a includes a chamber 61 for accommodating a wafer W. The chamber 61 is formed of a stationary lower container 61a, and a lid 61b that covers the lower container 61a. The lid 61b is movable up and down by an elevating unit (not shown). The lower container 61a includes a hot plate 62, around which nitrogen gas with vapor of a silylation agent carried therein, such as DMSDMA (Dimethylsilyldimethylamine), is supplied into the chamber 61. DMSDMA is vaporized into a gaseous state by a vaporizer 63, and carried by $N_2$ gas into the chamber 61.

The hot plate 62 is provided with a heater 62a built therein, by which the hot plate 62 is adjustable in temperature within a range of, e.g., from a room temperature to 200° C. The hot plate 62 is provided with pins 64 on the surface to support the wafer W. Where a wafer W is mounted not directly on the hot plate 62, the wafer W is prevented from being contaminated on its bottom. The lower container 61a is provided with first seal rings 65 disposed on the top face of the peripheral portion. The lid 61b is provided with second seal rings 66 disposed on the bottom face of the peripheral portion. When the lid 61b is pressed against the lower container 61a, the second seal rings 66 come into contact with the first seal rings 65. Two pairs of first and second seal rings 65 and 66 are disposed on inner and outer sides, and the space defined between the two pairs can be pressure-reduced. When the pressure of this space is reduced, it is ensured that the chamber 61 is airtight. The lid 61b has an exhaust port 67 essentially at the center for exhausting nitrogen gas with DMSDMA carried therein supplied into the chamber 61. The exhaust port 67 is connected to a vacuum pump 69 through a pressure adjusting unit 68.

In this embodiment, as described later, the control section 26 is preferably arranged to control the heater 62a to heat a wafer W before and/or after a silylation agent starts being supplied into the chamber. The heating temperature at this time is preferably set to be 50 to 150° C.

Figure 7:
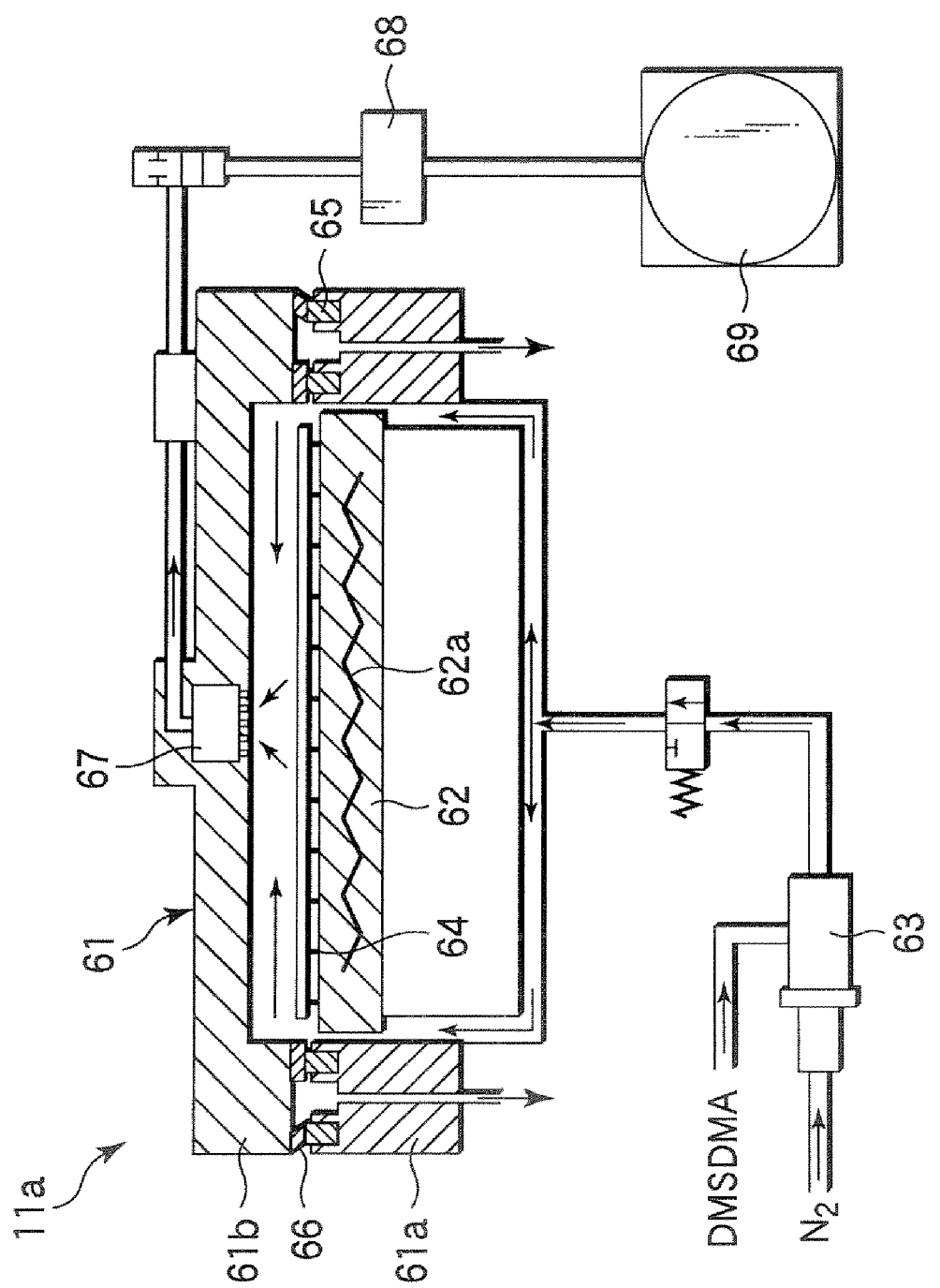
FIG. 7 is a sectional view schematically showing a silylation unit disposed in the denaturing/cleaning/recovering apparatus.

In FIG. 7, liquid DMSDMA is vaporized by the vaporizer 63, and carried by $N_2$ gas into the chamber 61. Alternatively, vaporized DMSDMA gas (i.e., DMSDMA vapor) may be solely supplied into the chamber 61. When DMSDMA is supplied into the chamber 61, the interior of the chamber 61 is maintained at a predetermined vacuum level. Accordingly, utilizing the pressure difference between the vaporizer 63 and chamber 61, DMSDMA gas is easily supplied into the chamber 61. The silylation unit (SCH) 11b has exactly the same structure as the silylation unit (SCH) 11a.

Next, a detailed explanation will be given of the structure of the cleaning unit 12a with reference to the schematic sectional view shown in FIG. 8. The cleaning unit (CNU) 12a includes an annular cup (CP) disposed at the center, and a spin chuck 71 disposed inside the cup (CP). The spin chuck 71 is arranged to fix and hold a wafer W by means of vacuum suction, and to be rotated by a drive motor 72 in this state. A drain line 73 is disposed at the bottom of the cup (CP) to exhaust the cleaning liquid and purified water.

The drive motor 72 is disposed to be movable up and down in an opening 74a formed in the unit bottom plate 74. The drive motor 72 is coupled with an elevating mechanism 76, such as an air cylinder, and a vertical guide 77 through a cap-like flange member 75.

The drive motor 72 is provided with a cylindrical cooling jacket 78 attached on its side. The flange member 75 is attached to cover the upper half of the cooling jacket 78.

When a chemical liquid or the like is supplied onto a wafer W, the lower end 75a of the flange member 75 comes into close contact with the unit bottom plate 74 near the rim of the opening 74a to make the unit interior airtight. When a wafer W is transferred between the spin chuck 71 and wafer transfer arm 14a, the drive motor 72 and spin chuck 71 are moved up by the elevating mechanism 76, so that the lower end 75a of the flange member 75 is separated upward from the unit bottom plate 74.

A cleaning liquid supply mechanism 80 is disposed above the cup (CP) to supply a predetermined cleaning liquid onto the surface of a wafer W. The cleaning liquid is used for dissolving a substance denatured by one of the denaturing units (VOS) 15a to 15f, such as a denatured resist film, present on the wafer.

The cleaning liquid supply mechanism 80 includes a cleaning liquid delivery nozzle 81, the cleaning liquid supply portion 17 described above, a scan arm 82, a vertical support member 85, and an X-axis driving mechanism 96. The cleaning liquid delivery nozzle 81 is arranged to deliver the cleaning liquid onto the surface of a wafer W held on the spin chuck 71. The cleaning liquid supply portion 17 is arranged to supply the predetermined cleaning liquid to the cleaning liquid delivery nozzle 81. The scan arm 82 is arranged to hold the cleaning liquid delivery nozzle 81, and to be movable back and forth in the Y-direction. The vertical support member 85 is arranged to support the scan arm 82. The X-axis driving mechanism 96 is disposed on a guide rail 84 extending in the X-axis direction on the unit bottom plate 74, and is arranged to shift the vertical support member 85a in the X-axis direction. The scan arm 82 is movable in the vertical direction (Z-direction) by a Z-axis driving mechanism 97, so that the cleaning liquid delivery nozzle 81 can be moved to an arbitrary position above a wafer W, and retreated to a predetermined position outside the cup (CP).

The cleaning liquid supply portion 17 can selectively supply one of a dissolving/removing liquid and a rinsing liquid consisting of purified water to the cleaning liquid delivery nozzle 81. The dissolving/removing liquid is used for dissolving a denatured substance, such as a sacrificial film, denatured by one of the denaturing units (VOS) 15a to 15f, and comprises, e.g., dilute hydrofluoric acid or an amine-based chemical solution. The cleaning units (CNU) 12b to 12d have exactly the same structure as the cleaning unit (CNU) 12a.

Figure 9:
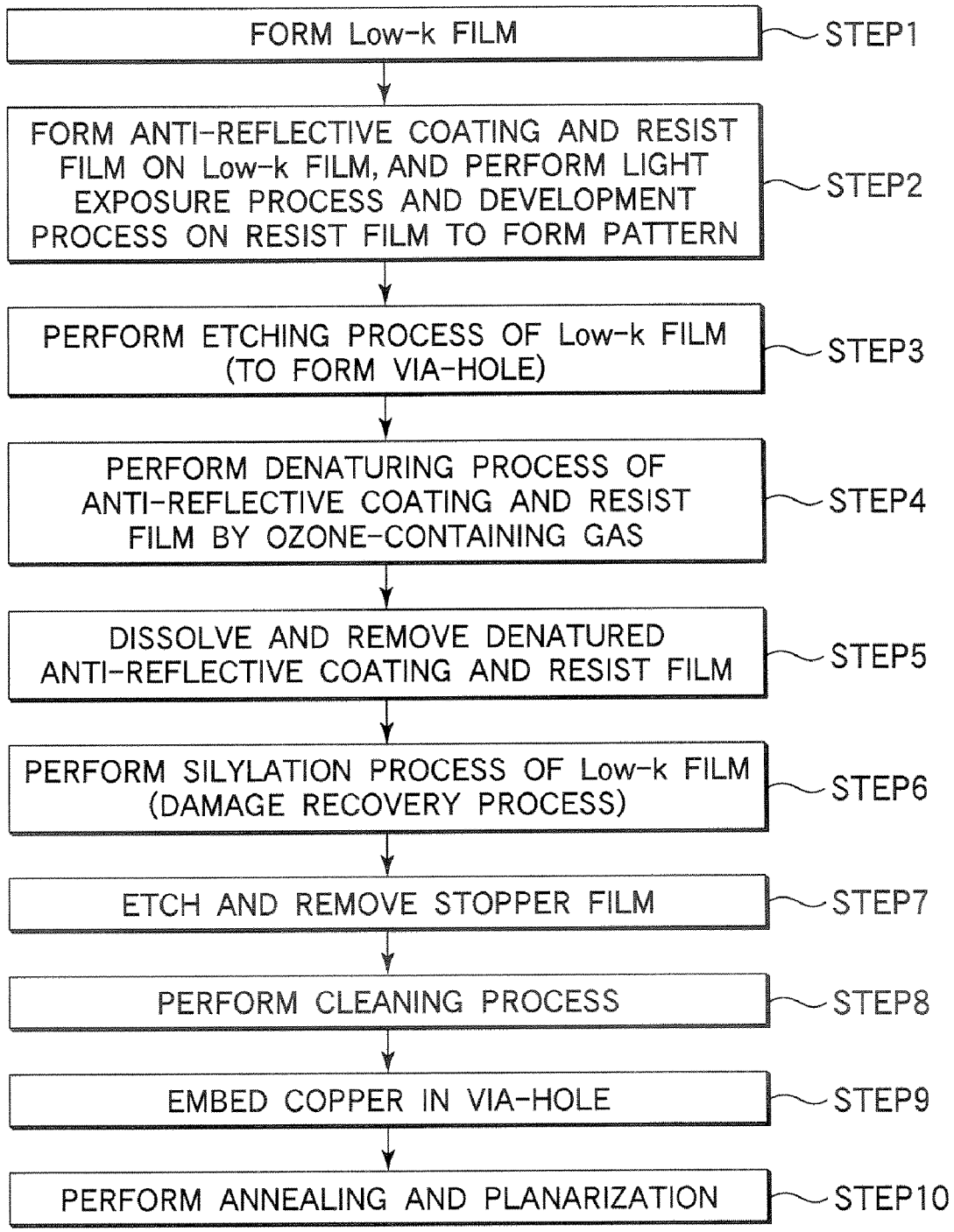
FIG. 9 is a flowchart showing a semiconductor device manufacturing process employing a single damascene method, performed by the semiconductor device manufacturing system shown in FIG. 2.

Next, an explanation will be given of a semiconductor device manufacturing process employing a single damascene method, performed by the semiconductor device manufacturing system shown in FIG. 2. FIG. 9 is a flowchart showing a manufacturing process of this kind. FIGS. 10A to 10H are sectional views showing steps of the flow shown in FIG. 9.

Figure 10A:
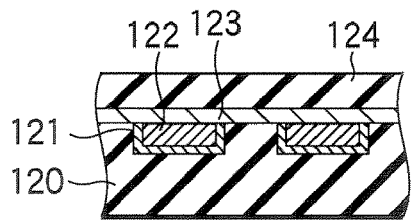
FIGS. 10A to 10H are sectional views showing steps of the flow shown in FIG. 9.

At first, a wafer W is prepared from an Si substrate (not shown) as follows. Specifically, an insulating film 120 is disposed on the substrate. A lower interconnection line 122 made of copper is disposed at an upper portion in the insulating film 120 with a barrier metal layer 121 interposed therebetween. A stopper film (such as an SiN film or SiC film) 123 is disposed on the insulating film 120 and lower interconnection line 122 made of copper. Then, the wafer W is transferred into the SOD apparatus 101, in which an inter-level insulating film (which will be referred to as a Low-k film, hereinafter) 124 made of a low dielectric constant material (Low-k material) is formed on the stopper film 123 (Step 1). Consequently, the state shown in FIG. 10A is obtained.

Figure 10B:
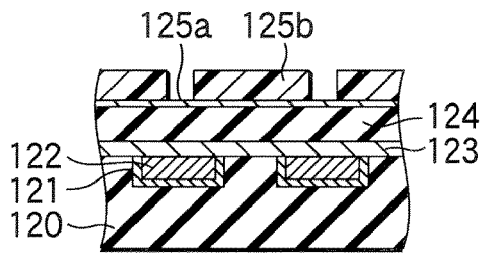

Then, the wafer W with the Low-k film 124 formed thereon is transferred into the resist coating/development apparatus 102, in which an anti-reflective coating 125a and a resist film 125b are sequentially formed on the Low-k film 124. Then, the wafer W is transferred into the light exposure apparatus 103, in which the wafer W is subjected to a light exposure process with a predetermined pattern. Then, the wafer W is transferred back into the resist coating/development apparatus 102, in which the resist film 125b is subjected to a development process by the developing unit to form a predetermined circuit pattern on the resist film 125b (Step 2). Consequently, the state shown in FIG. 10B is obtained.

Figure 10C:
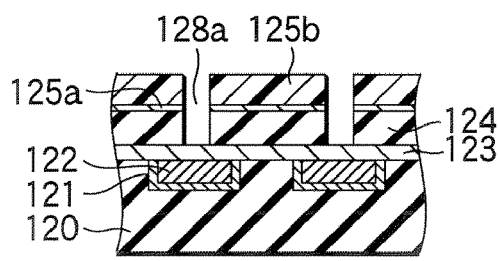
Figure 10D:
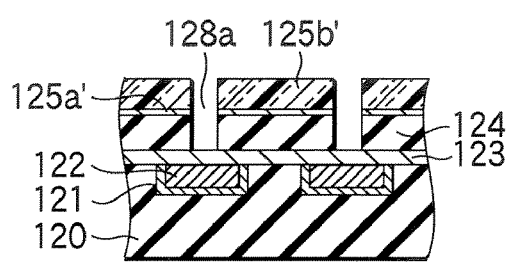

Then, the wafer W is transferred into the etching apparatus 105, in which an etching process is performed on the wafer W (Step 3). Consequently, a via-hole 128a reaching the stopper film 123 is formed in the Low-k film 124 (FIG. 10C).

The wafer W thus treated by the etching process is transferred into the denaturing/cleaning/recovering apparatus 104, in which the wafer W is first processed by one of the denaturing units (VOS) 15a to 15f. In this process, a gas containing ozone, such as a mixture gas of ozone and water vapor or ozone alone, is used to denature the anti-reflective coating 125a and resist film 125b into denatured films 125a' and 125b+, which are soluble in water or a predetermined chemical liquid (Step 4 and FIG. 10D).

Specifically, at first, a wafer W present at a predetermined position within a carrier C is transferred into the wafer mount unit (TRS) 13b. Then, the wafer W placed in the wafer mount unit (TRS) 13b is transferred by the wafer transfer arm 14a into one of the denaturing units (VOS) 15a to 15f (e.g., 15a). At this time, while the lid 41b is retreated above the lower container 41a, the wafer W is inserted at a position slightly higher than the portions for supporting the wafer W in the hook members 46 attached to the lid 41b (portions extending in the horizontal direction), and is transferred onto the hook members 46. Then, the lid 41b is moved down to bring the lid 41b into close contact with the lower container 41a, and the lock mechanism 35 is further operated to set the chamber 30 in an airtight state. When the lid 41b is moved down, the wafer W is transferred from the hook members 46 onto the proximity pins 44 on the way. Then, the stage 33 is maintained at a predetermined temperature by the heaters 45a and 45b. At this time, the temperature of the wafer or substrate is preferably set to be 100 to 15° C., and typically at 105° C.

When the stage 33 and lid 41b are set at predetermined temperatures, and the temperature distribution of the wafer W becomes essentially uniform, an ozone/nitrogen mixture gas (with an ozone content of 9% and at a flow rate of 4 L/min, for example) is first solely supplied from the process gas supply portion 16 into the chamber 30. At this time, the gas is adjusted such that the chamber 30 is filled with the ozone/nitrogen mixture gas to have a predetermined pressure. Specifically, the ozone concentration is preferably set to be 1 to 20%, and typically at 9%. Where the concentration is set at 9%, the ozone flow rate is preferably set to be 1 to 10 L/min, and typically at 4 L/min. The pressure inside the chamber 30 is preferably set to be 200 kPa or less, so as to be a predetermined positive pressure. Thereafter, a process gas prepared by mixing water vapor with the ozone/nitrogen mixture gas is supplied from the process gas supply portion 16 into the chamber 30. At this time, the water vapor flow rate is preferably set to be 0 to 10 mL/min, and typically at 5 mL/min. Where the water vapor flow rate is set at 0 mL/min, the process is performed only by the ozone/nitrogen mixture gas. With this process gas, the anti-reflective coating 125a and resist film 125b formed on the wafer W are denatured to be easily dissolved in water or a specific chemical liquid. At this time, the process time is set to be, e.g., 30 to 600 sec, and typically at 300 sec.

When the process using the process gas on the wafer W is finished, the supply of the process gas is stopped. Further, nitrogen gas is supplied from the process gas supply portion 16 into the chamber 30 to purge the interior of the chamber 30 with nitrogen gas. This purge process is performed to completely exhaust the ozone/nitrogen mixture gas even from the exhaust unit 32, so that no ozone/nitrogen mixture gas flows from the exhaust unit 32 back into the chamber 30 and leaks out of the chamber 30 when the chamber 30 is opened thereafter.

Figure 10E:
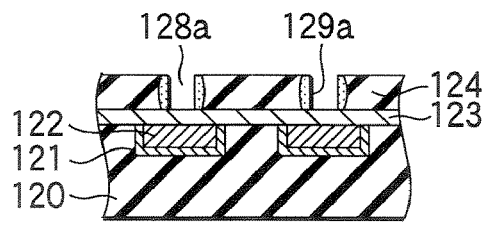

The wafer W treated by the denaturing process is transferred into one of the cleaning units (CNU) 12a to 12d, in which a dissolving/removing process is performed to remove the denatured films 125a' and 125b', i.e., the denatured anti-reflective coating and the denatured resist film (Step 5 and FIG. 10E). At this time, where the anti-reflective coating 125a and resist film 125b have been denatured to be soluble in water, they can be dissolved and removed by supplying purified water. Alternatively, where they have been denatured to be soluble in a predetermined chemical liquid instead of water, they can be dissolved and removed by supplying this chemical liquid.

Figure 11:
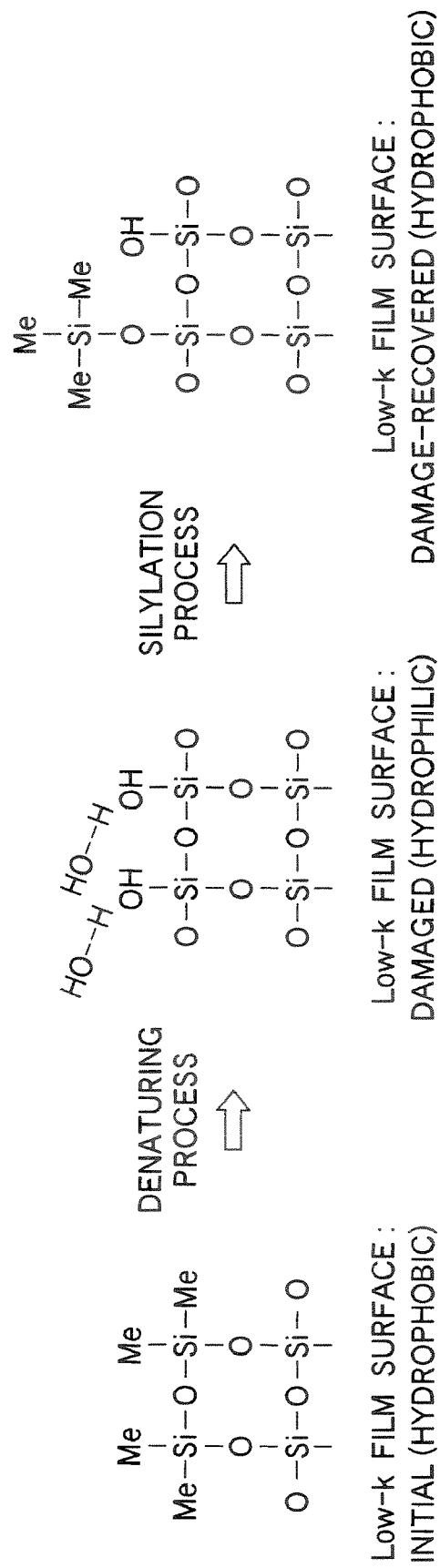
FIG. 11 is a view for explaining damage of a Low-k film and a recovery mechanism thereof by silylation.

When the anti-reflective coating 125a and resist film 125b are removed, as described above, the sidewall of the via-hole 128a formed in the Low-k film 124 is damaged, so damaged portions 129a are formed, as shown in FIG. 10E. Specifically, as shown in FIG. 11, the Low-k film 124 that has methyl groups (Me) as end groups and thus is hydrophobic reacts with moisture during the denaturing process. Consequently, the number of methyl groups is decreased and the number of hydroxyl groups is increased near the sidewall of the via-hole 128a, so the film is damaged and increases the dielectric constant.

Although FIG. 10E schematically shows a damaged portion 129a, the boundary between the damaged portion 129a and non-damaged portion is not clear unlike the drawings.

If the via-hole 128a with the damaged portions 129a formed in the sidewall is filled with a metal material to form a connection line, problems arise such that the parasitic capacitance between interconnection lines is increased, so a signal delay occurs and the insulation between interconnection lines is deteriorated.

Figure 10F:
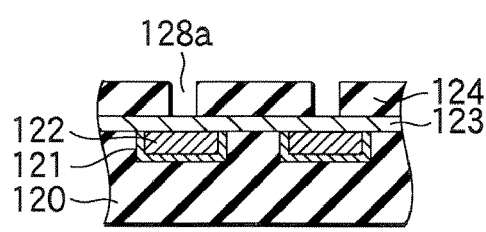

Accordingly, after the resist film and so forth are removed, in order to recover the damage of the Low-k film 124, the wafer W is transferred into one of the silylation units (SCH) 11a and 11b, in which a silylation process is performed as a recovery process for the damaged portions (Step 6 and FIG. 10F). This process allows the damage to be recovered, so that the specific dielectric constant of the Low-k film 124 is returned to a state near the initial state. The conditions of the silylation process are suitably selected in accordance with the type of the silylation agent (silylation gas), as follows. For example, the temperature of the vaporizer 63 is set to be from a room temperature to 50° C. The silylation agent flow rate is set to be 0.1 to 1.0 g/min. The $N_2$ gas (purge gas) flow rate is set to be 1 to 10 L/min. The process pressure is set to be 666 to 96,000 Pa (5 to 720 Torr). The temperature of the hot plate 62 is set to be from a room temperature to 200° C.

In this case, before the silylation agent is supplied, heating (pre-baking) of the wafer W is preferably performed by the heater 62a. With this heating, moisture remaining on the wafer W is removed to adjust the moisture amount. If the silylation agent is supplied while the amount of moisture remaining on the wafer W is too much, the silylation agent reacts with $H_2O$, thereby generating particles and deteriorating the process. This problem about process deterioration can be prevented by performing pre-baking of the wafer W. However, if the pre-baking temperature is too high, the Low-k film damaged by the resist removal and so forth causes the following dehydration condensation, which inhibits a silylation reaction when the silylation gas is supplied thereafter.

This pre-baking is preferably performed under reduced pressure or low humidity condition at the predetermined time. The pre-baking under above condition leads to higher effect.

Further, if the silylation agent (silylation gas) is supplied while the wafer W is being heated higher than a predetermined temperature, the reaction proceeds only around the surface of the wafer W. On the other hand, where the silylation agent is supplied while the wafer W is being heated at a suitably lower temperature, the silylation agent enters fine pores of the Low-k film, which is particularly prominent in a porous Low-k film with a low dielectric constant. Consequently, the silylation reaction takes place inside the film, and the damage recovery is thereby further promoted.

In light of these factors, where the pre-baking is performed, the temperature of the wafer W is set to be 50° C. or more to provide the effect described above, and to be 200° C. or less to prevent the problems described above. In other words, the temperature is preferably set to be 50 to 200° C.

After the silylation agent starts being supplied, the wafer W is preferably heated to promote the reaction. At this time, the wafer temperature is preferably set to be 50 to 150° C. to suitably bring out the effect of promoting the reaction.

Although some of the effect may be provided by performing only one of the heating (preheating) before starting supply of the silylation agent and the heating after starting supply of the silylation agent, the effect is enhanced by performing both of them. In this case, the heating temperature after starting supply of the silylation agent is preferably set to be higher than the heating temperature before starting supply of the silylation agent. In order to realize such a two-step heating, the following method may be used. Specifically, the hot plate 62 is heated in advance by the heater 62a to a second temperature corresponding to the temperature necessary after starting supply of the silylation agent. Then, the wafer W is supported by lifter pins (not shown in FIG. 7) set at a raised position, so that the wafer W is heated to a first temperature lower than the second temperature. Then, after starting supply of the silylation agent, the wafer is moved down, so that the wafer W is heated to the second temperature. Alternatively, the following method may be adopted. Specifically, the pre-baking is performed while the wafer is placed on a table and is heated to the first temperature by a lamp disposed as heating means. Then, after starting supply of the silylation agent, the output to the lamp is increased to heat the wafer to the second temperature.

Where DMSDMA is used as the silylation agent, the following method may be used, for example. Specifically, the hot plate 62 is set at a predetermined temperature, and the inner pressure of the chamber 61 is decreased to 5 Torr (=666 Pa). Then, DMSDMA vapor carried by nitrogen gas is supplied into the chamber 61 until the inner pressure reaches 55 Torr. Then, the process is performed for, e.g., three minutes, while maintaining the pressure. The silylation reaction using DMSDMA is expressed by the following reaction formula.

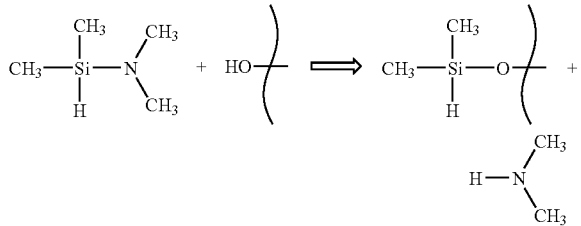

The silylation agent is not limited to DMSDMA described above, and the agent may comprise any substance as long as it causes a silylation reaction. However, it is preferable to use a substance having a relatively small molecular structure selected from the compounds including silazane bonds (Si—N bonds) in molecules, such as a substance having a molecular weight preferably of 260 or less, and more preferably of 170 or less. Namely, examples other than DMSDMA and HMDS are TMSDMA (Dimethylaminotrimethylsilane), TMDS (1,1,3,3-Tetramethyldisilazane), TMSPyrole (1-Trimethylsilylpyrole), BSTFA (N,O-Bis(trimethylsilyl)trifluoroacetamide), and BDMADMS (Bis(dimethylamino)dimethylsilane). The chemical structures of these substances are as follows.

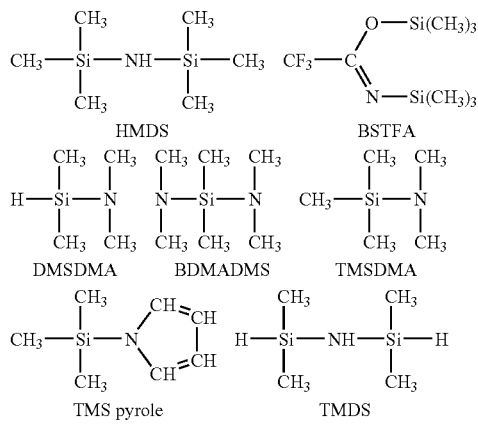

Of the compound set out above, TMSDMA and TMDS are preferably used, because they are high in the effect of recovering the dielectric constant, and the effect of decreasing the leakage current. Further, in light of the stability after silylation, it is preferable to use a substance (such as TMSDMA or HMDS) having a structure in which Si of each silazane bond is bonded to three alkyl groups (such as methyl groups).

In order to enhance the recovering effect of the silylation process, a cleaning process by a chemical liquid, such as an alkaline chemical solution, is preferably performed after the resist film is removed, and before the silylation process is performed.

Figure 10G:
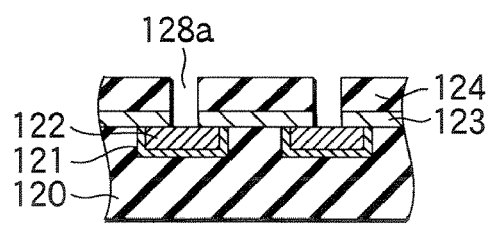
Figure 10H:
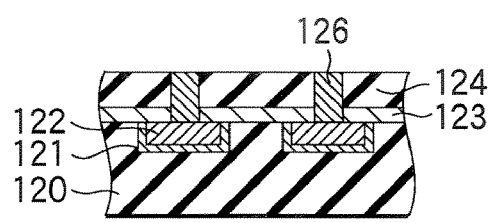

The wafer W thus treated by the silylation process is transferred into the etching apparatus 105, in which an etching process is performed to remove the stopper film 123 (Step 7 and FIG. 10G). Then, the wafer W is transferred into the denaturing/cleaning/recovering apparatus 104, in which a cleaning process is performed by one of the cleaning units (CNU) 12a to 12d (Step 8). The Low-k film 124 may be damaged by the etching process and/or cleaning process. In this case, a silylation process may be performed in the same manner as described above.

Thereafter, the wafer W is transferred into the sputtering apparatus 106, in which a barrier metal film and a Cu seed layer (i.e., plating seed layer) are formed on the inner surface of the via-hole 128a. Then, the wafer W is transferred into the electrolytic plating apparatus 107, in which copper 126 used as an interconnection line metal is embedded in the via-hole 128a by electrolytic plating (Step 9 and FIG. 10H). Then, the wafer W is subjected to a heat process to perform an annealing process of the copper 126 embedded in the via-hole 128a (no annealing apparatus is shown in FIG. 2). Then, the wafer W is transferred into the CMP apparatus 109, in which a planarization process is performed on the wafer W by a CMP method (Step 10). Consequently, a predetermined semiconductor device is manufactured.

As described above, where a semiconductor device is manufactured, the denaturing process and cleaning process are performed by a process gas containing ozone. Consequently, as compared to a case where ashing is used, the Low-k film is less damaged when the resist film and so forth are removed. Further, since the silylation process provides an excellent effect of recovering the damage, the specific dielectric constant of the film is sufficiently recovered. Consequently, it is possible to provide a semiconductor device with excellent electrical characteristics, and to thereby improve the reliability of the semiconductor device.

Figure 12:
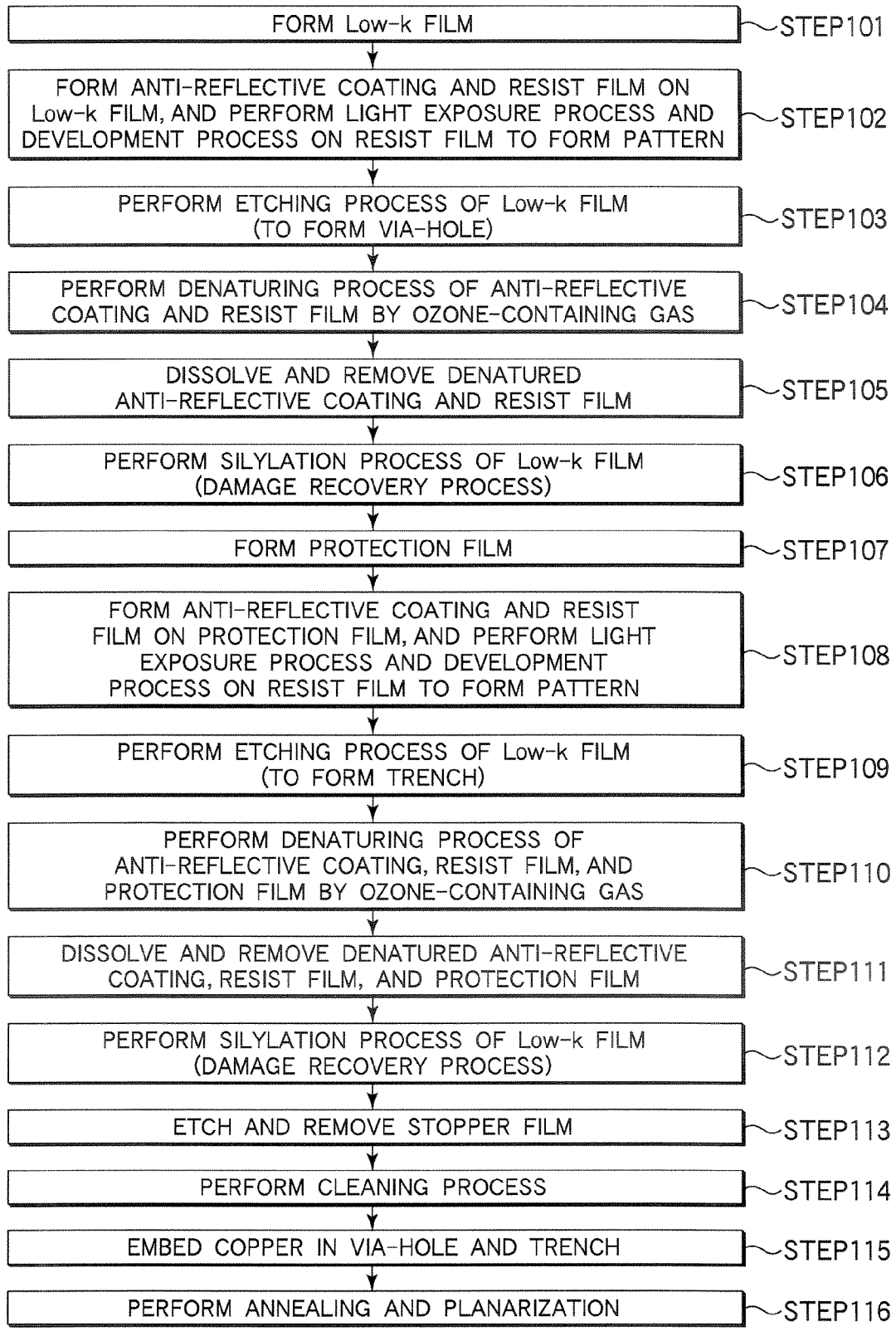
FIG. 12 is a flowchart showing a semiconductor device manufacturing process employing a dual damascene method, performed by the semiconductor device manufacturing system shown in FIG. 2.

Next, an explanation will be given of a semiconductor device manufacturing process employing a dual damascene method, performed by the semiconductor device manufacturing system shown in FIG. 2. FIG. 12 is a flowchart showing a manufacturing process of this kind. FIGS. 13A to 13K are sectional views showing steps of the flow shown in FIG. 12. In this embodiment, the apparatuses used in the respective steps will not be explained, because they have been clarified by the preceding explanation.

At first, as in the case using a single damascene method described above, a wafer W is prepared from an Si substrate (not shown) as follows. Specifically, an insulating film 120 is disposed on the substrate. A lower interconnection line 122 made of copper is disposed at an upper portion in the insulating film 120 with a barrier metal layer 121 interposed therebetween. A stopper film (such as an SiN film or SiC film) 123 is disposed on the insulating film 120 and lower interconnection line 122 made of copper. Then, a Low-k film 124 made of a low dielectric constant material (Low-k material) is formed on the stopper film 123 on this wafer W (Step 101 and FIG. 13A).

Then, an anti-reflective coating 125a and a resist film 125b are sequentially formed on the Low-k film 124. Then, the wafer W is subjected to a light exposure process with a predetermined pattern. Then, the resist film 125b is subjected to a development process to form a predetermined circuit pattern on the resist film 125b (Step 102 and FIG. 13B).

Figure 13A:
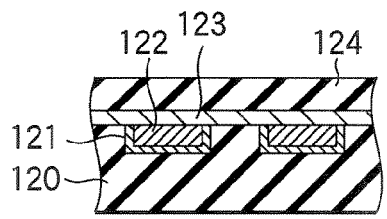
FIGS. 13A to 13K are sectional views showing steps of the flow shown in FIG. 12.
Figure 13B:
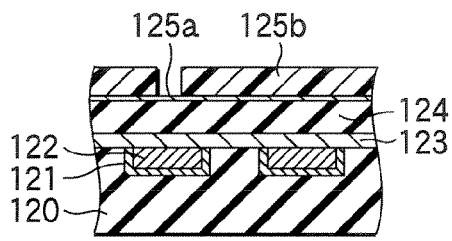
Figure 13C:
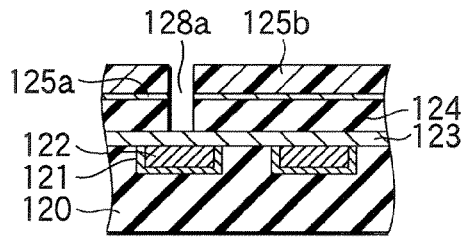

Then, an etching process using the resist film 125b as an etching mask is performed to form a via-hole 128a reaching the stopper film 123 (Step 103 and FIG. 13C).

Then, using a gas containing ozone, such as a mixture gas of ozone and water vapor or ozone alone, the anti-reflective coating 125a and resist film 125b are denatured to be soluble in water or a predetermined chemical liquid (Step 104). Then, using purified water or the predetermined chemical liquid, the denatured anti-reflective coating and resist film are dissolved and removed (Step 105), thereby obtaining the state shown in FIG. 13D.

Figure 13D:
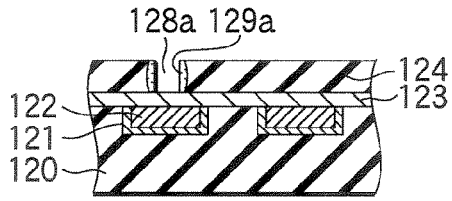
Figure 13E:
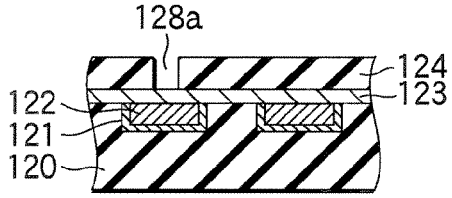
Figure 13F:
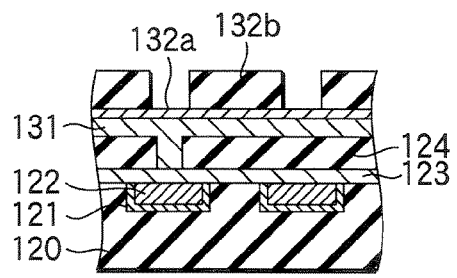

As in the first embodiment, when the anti-reflective coating 125a and resist film 125b are removed, as described above, the sidewall of the via-hole 128a formed in the Low-k film 124 is damaged, so damaged portions 129a are formed, as shown in FIG. 13D. Accordingly, as in the first embodiment, after the resist film and so forth are removed, in order to recover the damage of the Low-k film 124, a silylation process is performed as a recovery process on the wafer W for the damaged portions (Step 106 and FIG. 13E).

Then, a protection film (sacrificial film) 131 is formed on the surface of the Low-k film 124 (Step 107). Then, an anti-reflective coating 132a and a resist film 132b are sequentially formed on the protection film 131. Then, the resist film 132b is subjected to a light exposure process with a predetermined pattern, and then to a development process to form a circuit pattern on the resist film 132b (Step 108 and FIG. 13F). The protection film 131 can be formed from a predetermined chemical liquid applied by spin coating in the SOD apparatus 101. The protection film 131 is not necessarily required, so the anti-reflective coating 132a and resist film 132b may be formed directly on the Low-k film 124.

Figure 13G:
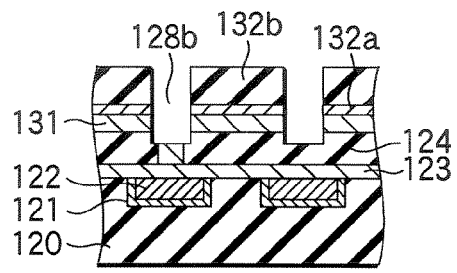

Then, an etching process using the resist film 132b as an etching mask is performed to form a trench 128b in the Low-k film 124 (Step 109 and FIG. 13G).

Thereafter, using a gas containing ozone, such as a mixture gas of ozone and water vapor or ozone alone, the anti-reflective coating 132a, resist film 132b, and protection film 131 are denatured to be soluble in water or a predetermined chemical liquid (Step 110). Then, using purified water or the predetermined chemical liquid, the denatured anti-reflective coating, resist film, and protection film are dissolved and removed (Step 111), thereby obtaining the state shown in FIG. 13H.

Figure 13H:
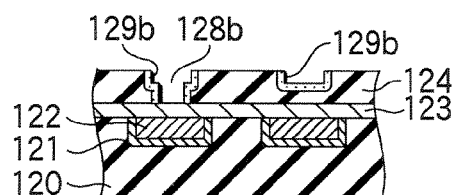
Figure 13I:
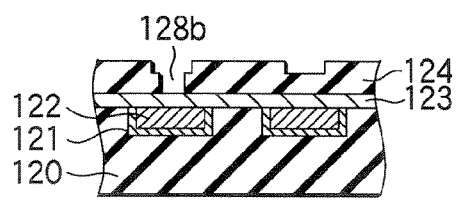
Figure 13J:
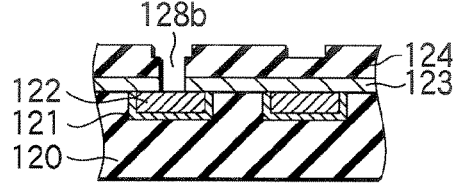
Figure 13K:
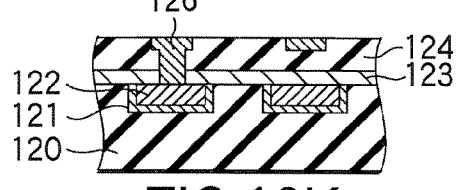

When the anti-reflective coating 132a, resist film 132b, and protection film 131 are removed, as described above, the sidewall of the trench 128b and the sidewall of the via-hole 128a formed in the Low-k film 124 is damaged, so damaged portions 129b are formed, as shown in FIG. 13H. Accordingly, after the resist film and so forth are removed, in order to recover the damage of the Low-k film 124, a silylation process is performed as a recovery process on the wafer W for the damaged portions (Step 112 and FIG. 13I), as in Step 106.

Then, the wafer W thus treated by the silylation process is subjected to an etching process (Step 113 and FIG. 13J), and then to a cleaning process (Step 114), to remove the stopper film 123. The Low-k film 124 may be damaged by the etching process and/or cleaning process. In this case, a silylation process may be performed in the same manner as described above.

Thereafter, a barrier metal film and a Cu seed layer (i.e., plating seed layer) are formed on the inner surface of the trench 128b and via-hole 128a. Then, copper 126 used as an interconnection line metal is embedded in the trench 128b and via-hole 128a by electrolytic plating (Step 115 and FIG. 13K). Then, the wafer W is subjected to a heat process to perform an annealing process of the copper 126 embedded in the trench 128b and via-hole 128a (no annealing apparatus is shown in FIG. 2). Then, the wafer W is transferred into the CMP apparatus 109, in which a planarization process is performed on the wafer W by a CMP method (Step 116). Consequently, a predetermined semiconductor device is manufactured.

As described above, also in a case where a dual damascene method is used to manufacture a semiconductor device, the denaturing process and cleaning process are performed by a process gas containing ozone, as in the case where a single damascene method is used. Consequently, as compared to a case where ashing is used, the Low-k film is less damaged when the resist film and so forth are removed. Further, since the silylation process provides an excellent effect of recovering the damage, the specific dielectric constant of the film is sufficiently recovered. Consequently, it is possible to provide a semiconductor device with excellent electrical characteristics, and to thereby improve the reliability of the semiconductor device.

Next, an explanation will be given of results of experiments conducted to confirm effects of the first embodiment.

Figure 14A:
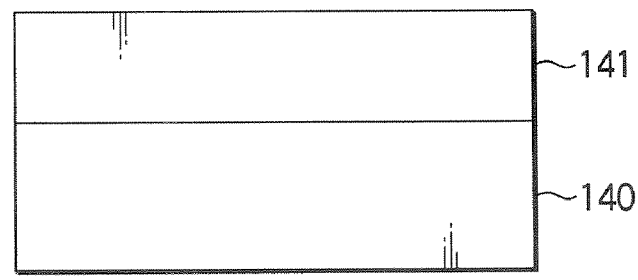
FIGS. 14A to 14C are sectional views showing samples used for confirming effects of the first embodiment.
Figure 14B:
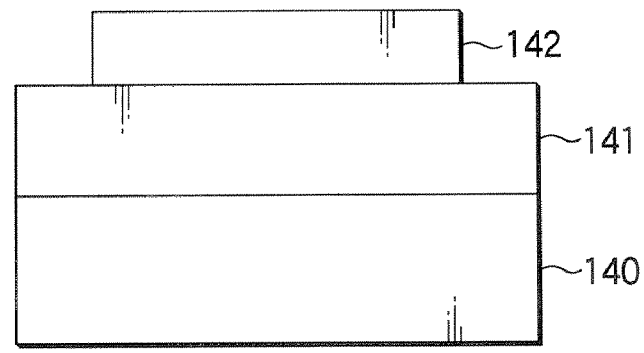
Figure 14C:
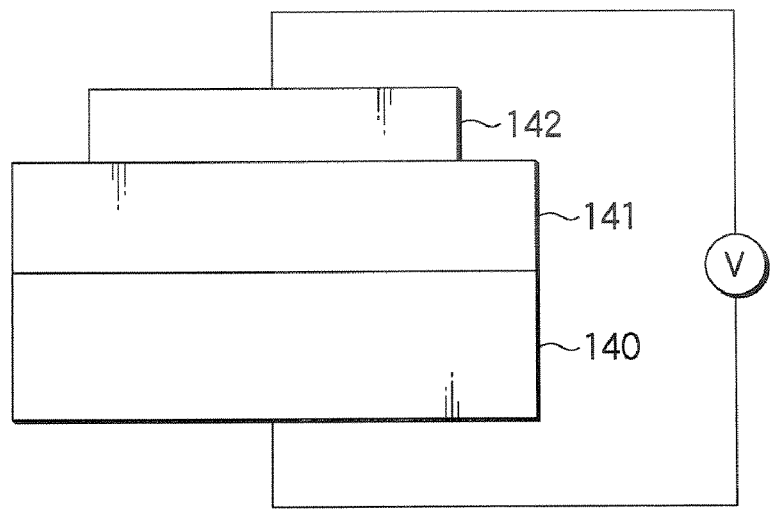

At first, samples were formed, as shown in FIG. 14A, such that each of which comprised an Si substrate 140 having a low resistivity and a Low-k film 141 disposed on the substrate 140. An unprocessed one of the samples was set as a reference (Sample 1). Another one of the samples was processed by ozone and water vapor (Sample 2). Other two of the samples were processed by ozone and water vapor and then subjected to a silylation process (Samples 3 and 4). Another one of the samples was processed by ozone and water vapor, then processed by an alkaline chemical solution (choline), and then subjected to a silylation process (Sample 5), As shown in FIG. 14B, each of the samples thus prepared was provided with an Al-sputtering electrode 142 formed on the Low-k film 141. Then, as shown in FIG. 14C, while a voltage was applied between the Al-sputtering electrode 142 and Si substrate 140, the specific dielectric constant and leakage current value of the Low-k film 141 were measured.

As the Low-k film, an SOD film or CVD film was used. The process using ozone and water vapor was performed under conditions set at 105° C. and 75 kPa. The silylation process was performed under conditions set at 150° C. (Condition 1) for Sample 3, under conditions set at 180° C. (Condition 2) for Sample 4, and under conditions set to be the same as Condition 1 for Sample 5.

Table 1 shows results of this experiment. As shown in Table 1, the following matters were confirmed. Specifically, where the process using ozone and water vapor was performed, the specific dielectric constant and leakage current value were increased. However, where the silylation process was further performed as a recovery process, the specific dielectric constant and leakage current value became almost equal to those of the reference. In the case of Sample 5 where the alkaline chemical solution cleaning and silylation process were sequentially performed, the specific dielectric constant was further decreased. It should be noted that Sample 1 used as the reference rendered a specific dielectric constant slightly higher than the inherent value of the material, because Sample 1 had some denatured part left in the surface layer.

TABLE 1

| Sample No. | Conditions | Specific dielectric constant (k-value) | Leakage current value (A/cm$^2$) |
|---|---|---|---|
| 1 | Reference | 2.55 | $1.9 \times 10^{-10}$ |
| 2 | Ozone and water vapor process | 4.51 | $9.5 \times 10^{-5}$ |
| 3 | Ozone and water vapor process + Silylation process (Condition 1) | 2.69 | $4.3 \times 10^{-10}$ |
| 4 | Ozone and water vapor process + Silylation process (Condition 2) | 2.67 | $3.7 \times 10^{-10}$ |
| 5 | Ozone and water vapor process + Cleaning process + Silylation process | 2.35 | $7.8 \times 10^{-10}$ |

Next, an experiment was conducted to confirm the influence of the presence or absence of the water vapor in the ozone process.

At first, samples were formed to have the structure shown in FIG. 14A. An unprocessed one of the samples was set as a reference (Sample 6). Another one of the samples was processed by ozone and water vapor under Condition 1 described above (Sample 7). Another one of the samples was further processed by a silylation process in addition to the process given to Sample 7 (Sample 8). Another one of the samples was processed under the same conditions used for Sample 7 but excluding water vapor (Sample 9). Another one of the samples was further processed by a silylation process in addition to the process given to Sample 9 (Sample 10). Another one of the samples was processed by etching and O$_2$-ashing in this order to form a comparative example (Sample 11). Another one of the samples was further processed by a silylation process in addition to the process given to Sample 11 to form another comparative example (Sample 12). Then, as described above, each of the samples thus prepared was provided with an Al-sputtering electrode, and the specific dielectric constant and leakage current value of the Low-k film were measured. The material of the Low-k film and the conditions of the silylation process were set to be the same as those described above.

Table 2 shows results of this experiment. As shown in Table 2, the following matters were confirmed. Specifically, where the process was performed solely using ozone without using water vapor, the specific dielectric constant and leakage current value were increased, as in a case where the process was performed using ozone and water vapor. However, the increased degree was smaller and thus damage was smaller in the case solely using ozone without using water vapor. Where the silylation process was further performed as a recovery process, the specific dielectric constant and leakage current value became almost equal to those of the reference. Further, where the etching and $O_2$-ashing were performed, the recovery degree obtained by the silylation process was lower, as compared to a case where the ozone process was performed.

TABLE 2

| Sample No. | Removing process conditions | With or without silylation process | Specific dielectric constant (k-value) | Leakage current value (A/cm$^2$) |
|---|---|---|---|---|
| 6 | Reference | | 2.45 | $4.83 \times 10^{-9}$ |
| 7 | Ozone + Water vapor | Without | 3.55 | $5.03 \times 10^{-7}$ |
| 8 | Ozone + Water vapor | With | 2.79 | $2.05 \times 10^{-9}$ |
| 9 | Ozone alone | Without | 3.19 | $8.22 \times 10^{-8}$ |
| 10 | Ozone alone | With | 2.73 | $4.43 \times 10^{-9}$ |
| 11 | Etching + $O_2$-ashing | Without | 3.40 | $3.10 \times 10^{-5}$ |
| 12 | Etching + $O_2$-ashing | With | 2.95 | $7.60 \times 10^{-8}$ |

Next, an explanation will be given of a second embodiment.

Figure 15:
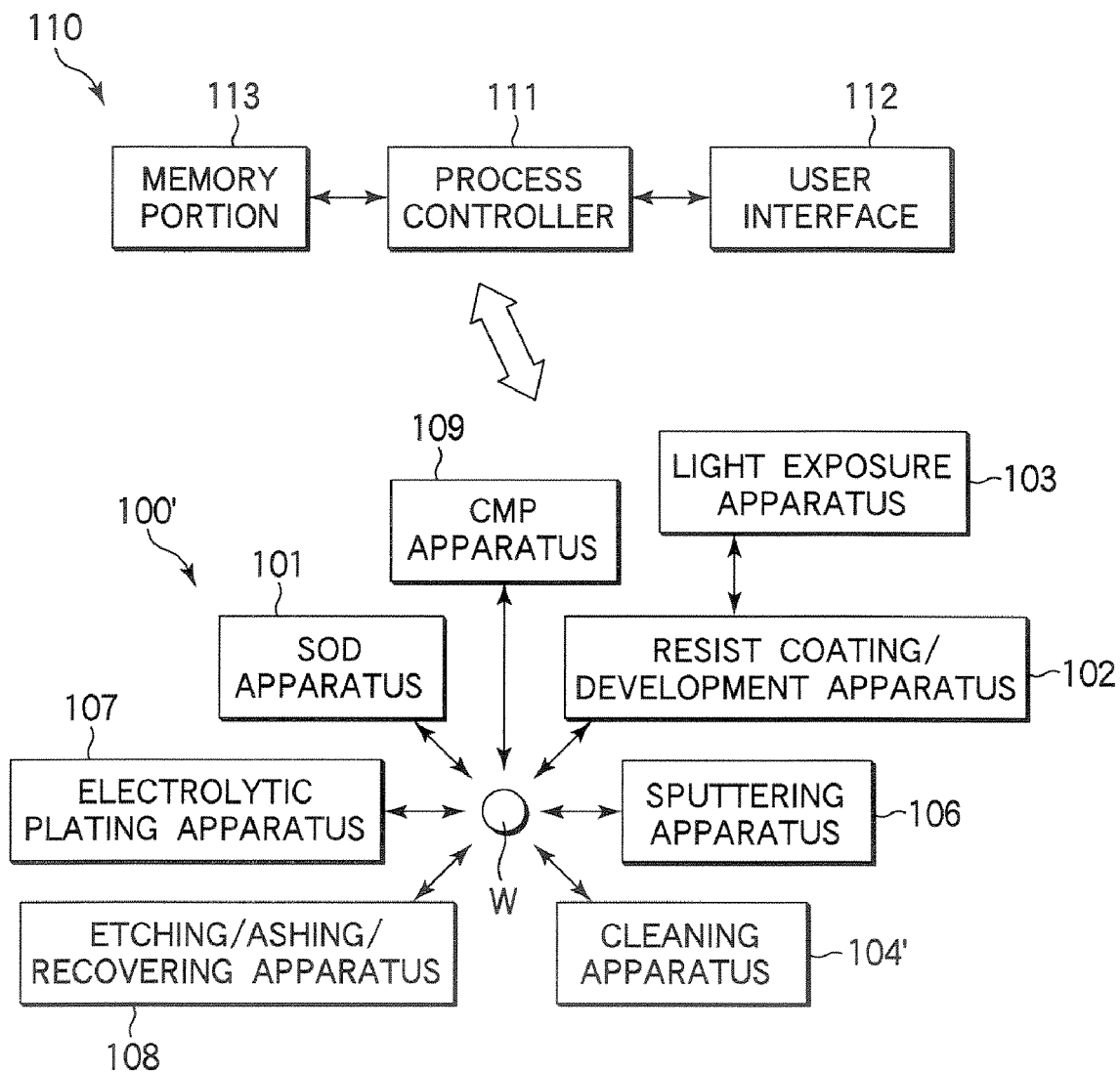
FIG. 15 is an explanatory view schematically showing the arrangement of a semiconductor device manufacturing system used for a semiconductor device manufacturing process according to a second embodiment of the present invention.

FIG. 15 is an explanatory view schematically showing the arrangement of a semiconductor device manufacturing system used for a semiconductor device manufacturing process according to a second embodiment of the present invention. In FIG. 15, the same constituent elements as those described above are denoted by the same reference numerals used in FIG. 2. This semiconductor device manufacturing system includes a process section 100' and a main control section 110 having the same structure as that shown in FIG. 2. The process section 100' includes an SOD (Spin On Dielectric) apparatus 101, a resist coating/development apparatus 102, a light exposure apparatus 103, a sputtering apparatus 106, an electrolytic plating apparatus 107, and a CMP apparatus 109 used as a polishing apparatus, which are the same as those in the first embodiment. The process section 100' further includes an etching/ashing/recovering apparatus 108 for performing dry etching, dry ashing, and recovery processes, and a cleaning apparatus 104'.

In other words, the semiconductor device manufacturing system according to this embodiment differs from the semiconductor device manufacturing system according to the first embodiment, in that the etching/ashing/recovering apparatus 108 and cleaning apparatus 104' are disposed in place of the etching apparatus 105 and denaturing/cleaning/recovering apparatus 104 shown in FIG. 2.

Figure 8:
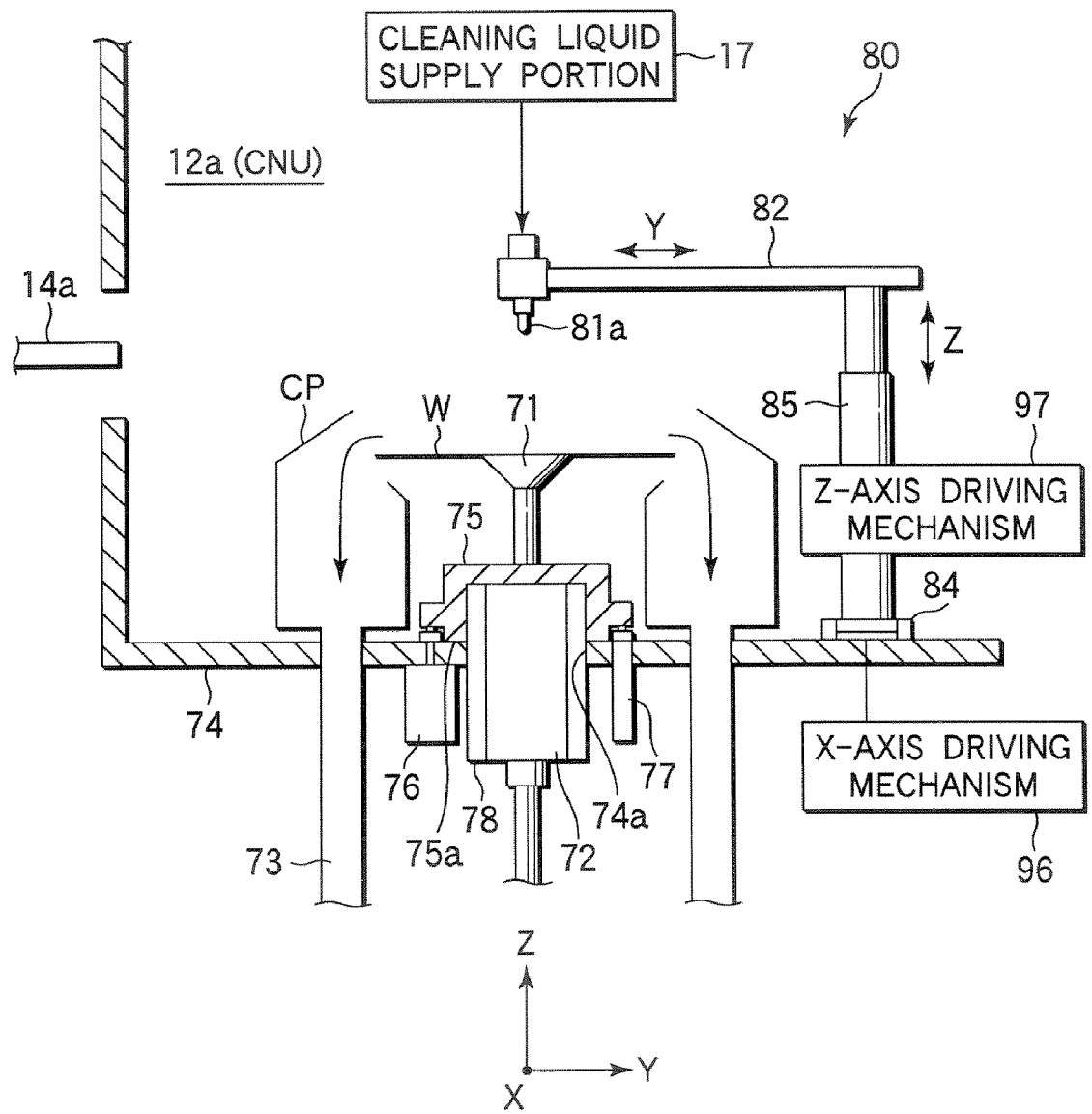
FIG. 8 is a sectional view schematically showing a cleaning unit disposed in the denaturing/cleaning/recovering apparatus.

The cleaning apparatus 104' includes a cleaning unit shown in FIG. 8, a heating mechanism, and a transfer system, to perform a cleaning process on a wafer W.

The etching/ashing/recovering apparatus 108 is arranged to perform, as described later, dry etching for forming a via-hole or trench with a predetermined pattern in an inter-level insulating film (Low-k film), dry ashing for removing a resist film, and a recovery process for recovering damage of an inter-level insulating film. These processes can be sequentially performed as dry processes in a vacuum.

Figure 16:
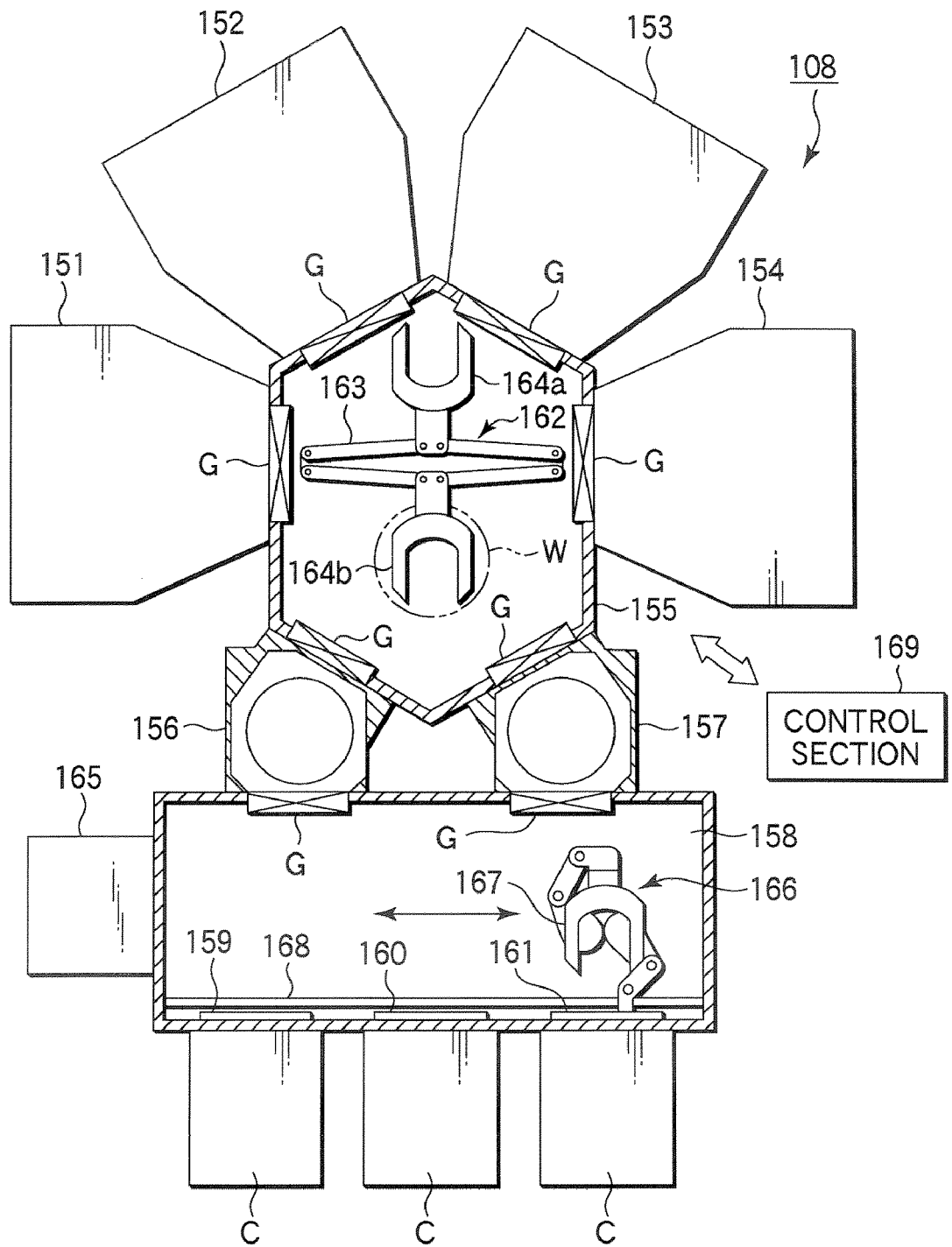
FIG. 16 is a plan view schematically showing the structure of an etching/ashing/recovering apparatus used in the semiconductor device manufacturing system shown in FIG. 15.

FIG. 16 is a plan view schematically showing the structure of the etching/ashing/recovering apparatus 108. The etching/ashing/recovering apparatus 108 includes etching units 151 and 152 for performing dry etching (plasma etching), an ashing unit 153 for performing dry ashing (plasma ashing), and a silylation unit (SCH) 154. These units 151 to 154 are disposed to respectively correspond to four sides of a hexagonal wafer transfer chamber 155. The other two sides of the wafer transfer chamber 155 are respectively connected to load-lock chambers 156 and 157. A wafer I/O (in/out) chamber 158 is connected to the load-lock chambers 156 and 157 on the side opposite to the wafer transfer chamber 155. The wafer I/O chamber 158 has three ports 159, 160, and 161 on the side opposite to the load-lock chambers 156 and 157, wherein the ports are used for respectively connecting three carriers C that can contain wafers W.

The etching units 151 and 152, ashing unit 153, silylation unit (SCH) 154, and load-lock chambers 156 and 157 are connected to the sides of the wafer transfer chamber 155 respectively through gate valves G, as shown in FIG. 16. Each of these units and chambers communicates with the wafer transfer chamber 155 when the corresponding gate valve G is opened, and is blocked from the wafer transfer chamber 155 when the corresponding gate valve G is closed. Gate valves G are also disposed between the load-lock chambers 156 and 157 and the wafer I/O chamber 158. Each of the load-lock chambers 156 and 157 communicates with the wafer I/O chamber 158 when the corresponding gate valve G is opened, and is blocked from the wafer I/O chamber 158 when the corresponding gate valve G is closed.

The wafer transfer chamber 155 is provided with a wafer transfer unit 162 disposed therein, for transferring wafers W to and from the etching units 151 and 152, ashing unit 153, silylation unit (SCH) 154, and load-lock chambers 156 and 157. The wafer transfer unit 162 is disposed essentially at the center of the wafer transfer chamber 155. The wafer transfer unit 162 includes two rotation/stretch portions 163, which are rotatable and extensible/contractible. Two blades 164a and 164b, each for supporting a wafer W, are respectively connected to the distal ends of the rotation/stretch portions 163. The two blades 164a and 164b are connected to the rotation/stretch portions 163 to face opposite directions. The interior of the wafer transfer chamber 155 can be maintained at a predetermined vacuum level.

The wafer I/O chamber 158 is provided with a HEPA filter (not shown) disposed on the ceiling, and clean air is supplied through the HEPA filter into the wafer I/O chamber 158 in a down flow state. A wafer W is transferred to and from the wafer I/O chamber 158 within a clean air atmosphere under atmospheric pressure. Each of the three ports 159, 160, and 161 of the wafer I/O chamber 158 for connecting a carrier C is provided with a shutter (not shown). A carrier C, which contains wafers W or is empty, is directly connected to each of the ports 159, 160, and 161, and the shutter is then opened for the carrier C to communicate with the wafer I/O chamber 158 while preventing inflow of outside air. An alignment chamber 165 for performing alignment of a wafer W is disposed on one side of the wafer I/O chamber 158.

The wafer I/O chamber 158 is provided with a wafer transfer unit 166 disposed therein, for transferring wafers W to and from the carriers C and load-lock chambers 156 and 157. The wafer transfer unit 166 includes articulated arm structures respectively having hands 167 at the distal ends. The wafer transfer unit 166 is movable on a rail 168 in a direction in which the carriers C are arrayed, to transfer a wafer W placed on each of the hands 167 at the distal ends. A control section 169 is arranged to control the operation of the wafer transfer units 162 and 166 and the entire system.

Next, an explanation will be given of the respective units.

At first, the ashing unit 153 will be explained. Since the outline of the structure of the etching units 151 and 152 is the same as the ashing unit except for the process gas, the explanation thereof will be omitted.

Figure 17:
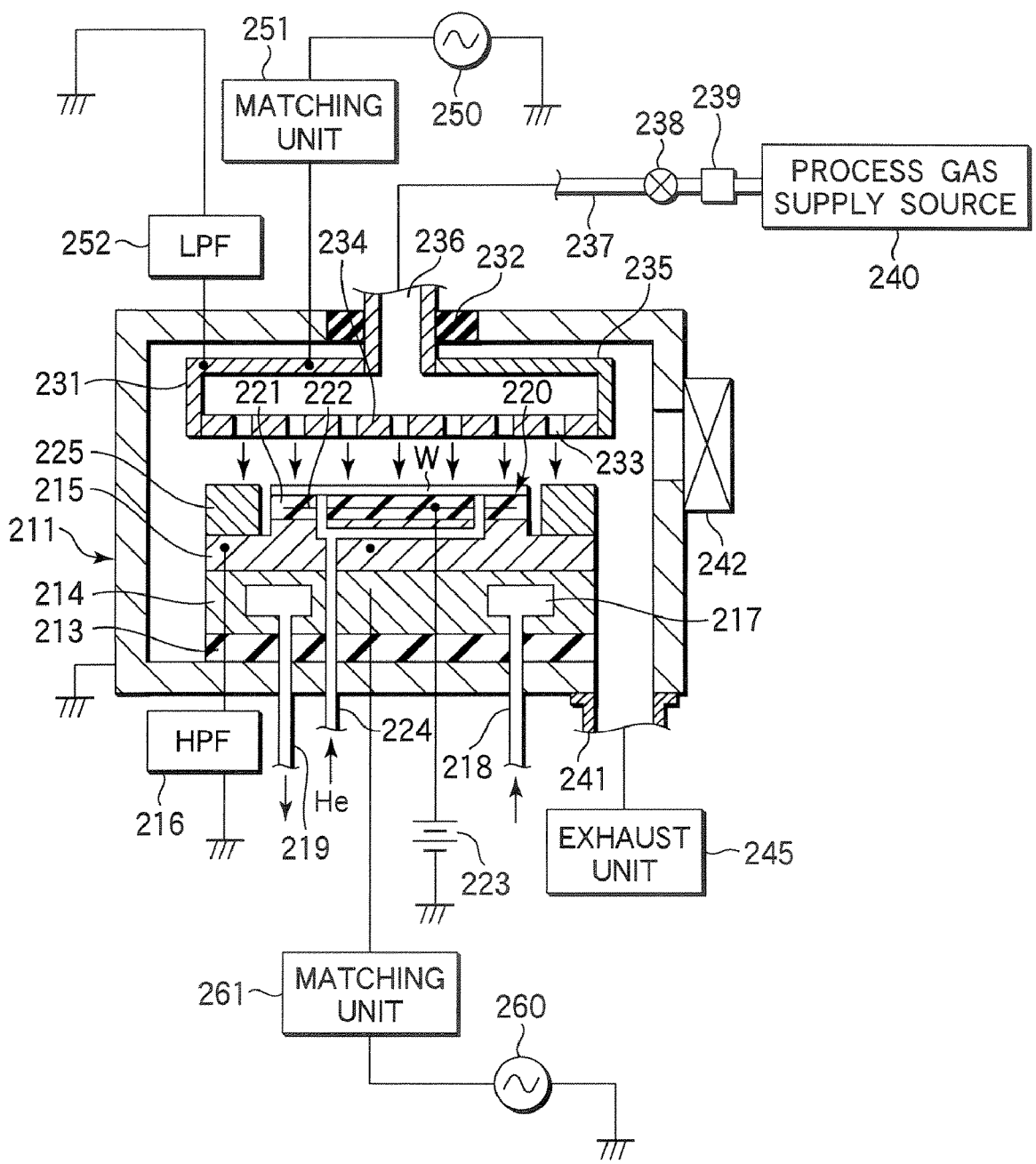
FIG. 17 is a sectional view schematically showing an ashing unit disposed in the etching/ashing/recovering apparatus.

As schematically shown in the structural view of FIG. 17, this ashing unit 153 is arranged to perform plasma ashing. The ashing unit 153 includes an essentially cylindrical process chamber 211. The process chamber 211 is provided with a susceptor 215 disposed therein on the bottom through an insulating plate 213 and a susceptor pedestal 214 in this order. The susceptor 215 is used as a lower electrode and has a top face provided with an electrostatic chuck 220, on which a wafer W is placed. A reference numeral 216 denotes a high-pass filter (HPF).

The susceptor pedestal 214 is provided with a temperature adjusting medium space 217 formed therein for circulating a temperature adjusting medium to adjust the susceptor 215 to a predetermined temperature. The temperature adjusting medium space 217 is connected to a supply line 218 and an exhaust line 219. The electrostatic chuck 220 has a structure in which an electrode 222 is sandwiched between insulating layers 221. When a DC (direct current) voltage is applied from a DC power supply 223 to the electrode, the W is attracted and held on the electrostatic chuck 222 by an electrostatic force. Further, a heat transmission gas, such as He gas, is supplied through a gas passage 224 to the bottom of the wafer W. The temperature of the wafer W is adjusted to a predetermined value through the heat transmission gas. An annular focus ring 225 is disposed on the top of the susceptor 215 at the rim to surround the wafer W placed on the electrostatic chuck 220.

An upper electrode 231 is disposed above the susceptor 215 to face the susceptor 215, and is supported inside the plasma process chamber 211 through an insulating body 232. The upper electrode 231 includes an electrode plate 234 having a number of gas delivery holes 233, and an electrode support 235 supporting the electrode plate 234, such that they form a shower structure.

The electrode support 235 has a gas feed port 236 formed therein at the center, which is connected to a gas supply line 237. The gas supply line 237 is connected to a process gas supply source 240 for supplying an ashing process gas through a valve 238 and a mass-flow controller 239. The ashing process gas, such as $O_2$ gas, NH3 gas, or $CO_2$ gas, is supplied from the process gas supply source 240 into the process chamber 211.

The bottom of the process chamber 211 is connected to an exhaust unit 245 through an exhaust line 241. The exhaust unit 245 includes a vacuum pump, such as a turbo molecular pump, to set the interior of the process chamber 211 at a predetermined vacuum atmosphere. The process chamber 211 has a gate valve 242 on the sidewall.

The upper electrode 231 is connected to a first RF (radio frequency) power supply 250 through a first matching unit 251 to supply an RF power for plasma generation. The upper electrode 231 is further connected to a low-pass filter (LPF) 252. On the other hand, the lower electrode or susceptor 215 is connected to a second RF power supply 260 through a second matching unit 261 to attract ions in plasma for the ashing to proceed.

In the ashing unit 153 thus structured, a predetermined ashing process gas is supplied from the process gas supply source 240 into the chamber 211, and is turned into plasma by an RF power applied from the first RF power supply 250. This plasma is used to ash a resist film and so forth present on the wafer W.

Figure 18:
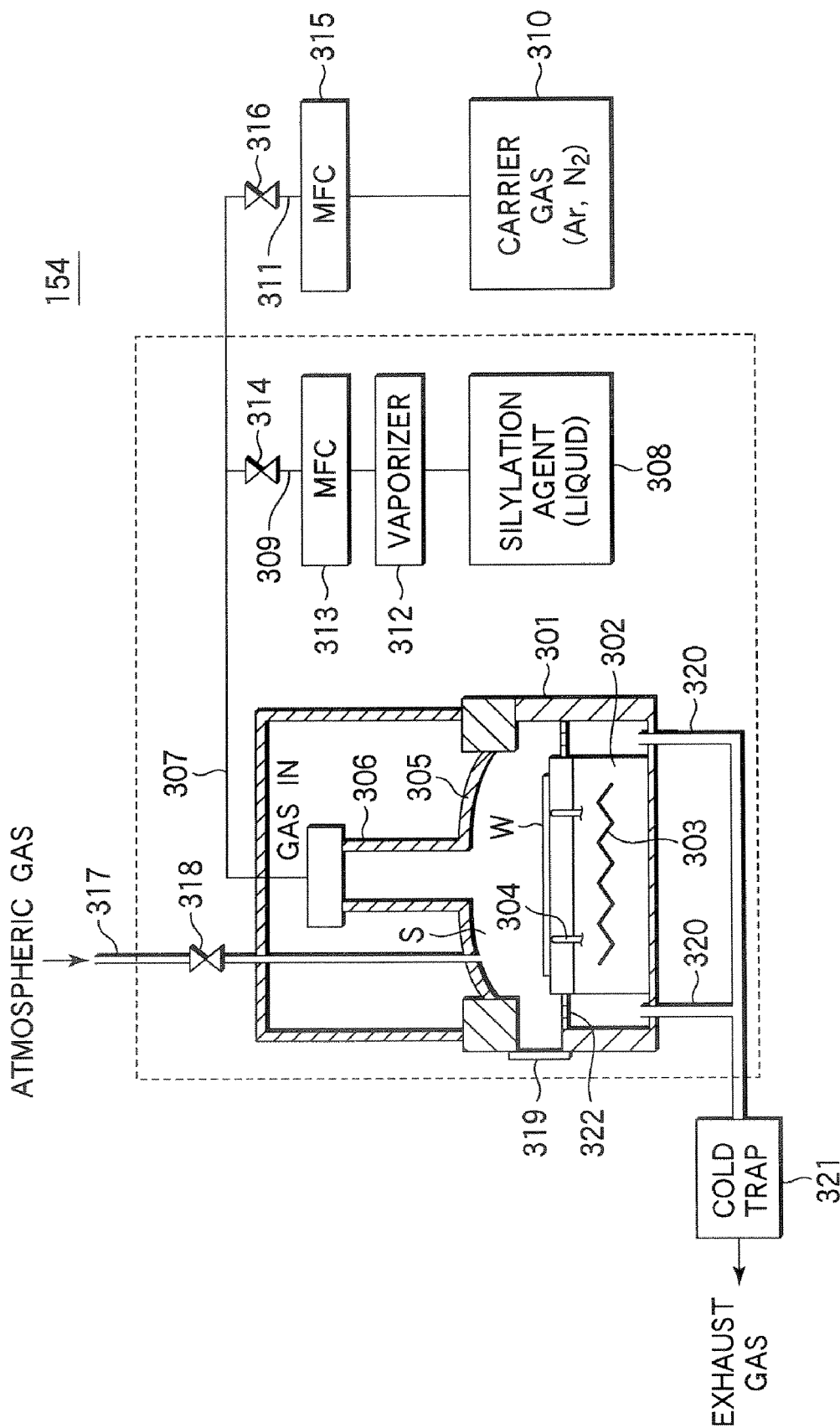
FIG. 18 is a sectional view schematically showing a silylation unit disposed in the etching/ashing/recovering apparatus.

Next, a detailed explanation will be given of the silylation unit (SCH) 154 with reference to the schematic sectional view shown in FIG. 18. The silylation unit (SCH) 154 includes a chamber 301 for accommodating a wafer W. The chamber 301 is provided with a wafer table 302 disposed therein at the bottom. The wafer table 302 includes a heater 303 built therein, by which the wafer W placed on the wafer table 302 can be heated at a predetermined temperature. The wafer table 302 is provided with wafer lifter pins 304, which can project and retreat to and from the top face. The lifter pins 304 can place the wafer W at a predetermined position above and separated from the wafer table 302, when the wafer W is transferred to and from the wafer table 302.

The chamber 301 contains an internal container 305, which defines a narrow process space S for accommodating the wafer W. A silylation agent (silylation gas) is supplied into this process space S. The internal container 305 has a gas feed passage 306 formed at the center and extending in a vertical direction.

The top of the gas feed passage 306 is connected to a gas supply line 307. The gas supply line 307 is connected to a line 309 extending from a silylation agent supply source 308 for supplying a silylation agent, such as DMSDMA (Dimethylsilyldimethylamine), and a line 311 extending from a carrier gas supply source 310 for supplying a carrier gas, such as Ar or $N_2$ gas. The line 309 is provided with a vaporizer 312 for vaporizing the silylation agent, a mass-flow controller 313 and a switching valve 314 disposed thereon in this order from the silylation agent supply source 308. The line 311 is provided with a mass-flow controller 315 and a switching valve 316 disposed thereon in this order from the carrier gas supply source 310. The silylation agent vaporized by the vaporizer 312 is carried by the carrier gas and is supplied through the gas supply line 307 and gas feed passage 306 into the process space S defined by the internal container 305. When the process is performed, the wafer W is heated by the heater 303 to a predetermined temperature. In this case, the wafer temperature can be controlled within a range of, e.g., from a room temperature to 300° C.

An atmospheric gas supply line 317 is disposed to extend from the atmospheric environment outside the chamber 301 to the internal container 305 inside the chamber 301. The atmospheric gas supply line 317 is provided with a valve 318 disposed thereon. When the valve 318 is opened, atmospheric gas comes into the process space S defined by the internal container 305 inside the chamber 301. Consequently, predetermined moisture is supplied onto the wafer W.

The chamber 301 has a gate valve 319 disposed on the sidewall. When the gate valve 319 is opened, the wafer W is transferred to and from the chamber 301. The bottom of the chamber 301 is connected to a vacuum pump (not shown) through an exhaust line 320 disposed at the periphery. The interior of the chamber 301 is exhausted by the vacuum pump through the exhaust line 320 and thereby controlled to have a pressure of, e.g., 10 Torr (266 Pa) or less. A cold trap 321 is disposed on the exhaust line 320. A baffle plate 322 is disposed between an upper portion of the wafer table 302 and the chamber wall.

The etching/ashing/recovering apparatus 108 is arranged to sequentially perform the etching, ashing, recovery process in a vacuum atmosphere. Accordingly, moisture is scarcely present in the space accommodating the wafer W as it is. In this state, the silylation unit (SCH) 153 may suffer a difficulty in causing the silylation reaction described above to attain a sufficient recovery effect. In light of this, as explained later in detail, the control section 169 performed the following control. Specifically, before starting supply of the silylation agent, the valve 318 on the atmospheric gas supply line 317 is opened to supply atmospheric gas so that moisture is adsorbed on the wafer W. Thereafter, the wafer W on the wafer table 302 is heated by the heater 303 to performed moisture adjustment, and then the silylation agent is supplied. At this time, the heating temperature is preferably set to be 50 to 200° C. In order to promote the silylation reaction, the wafer W may be heated also after starting supply of the silylation agent.

Figure 19:
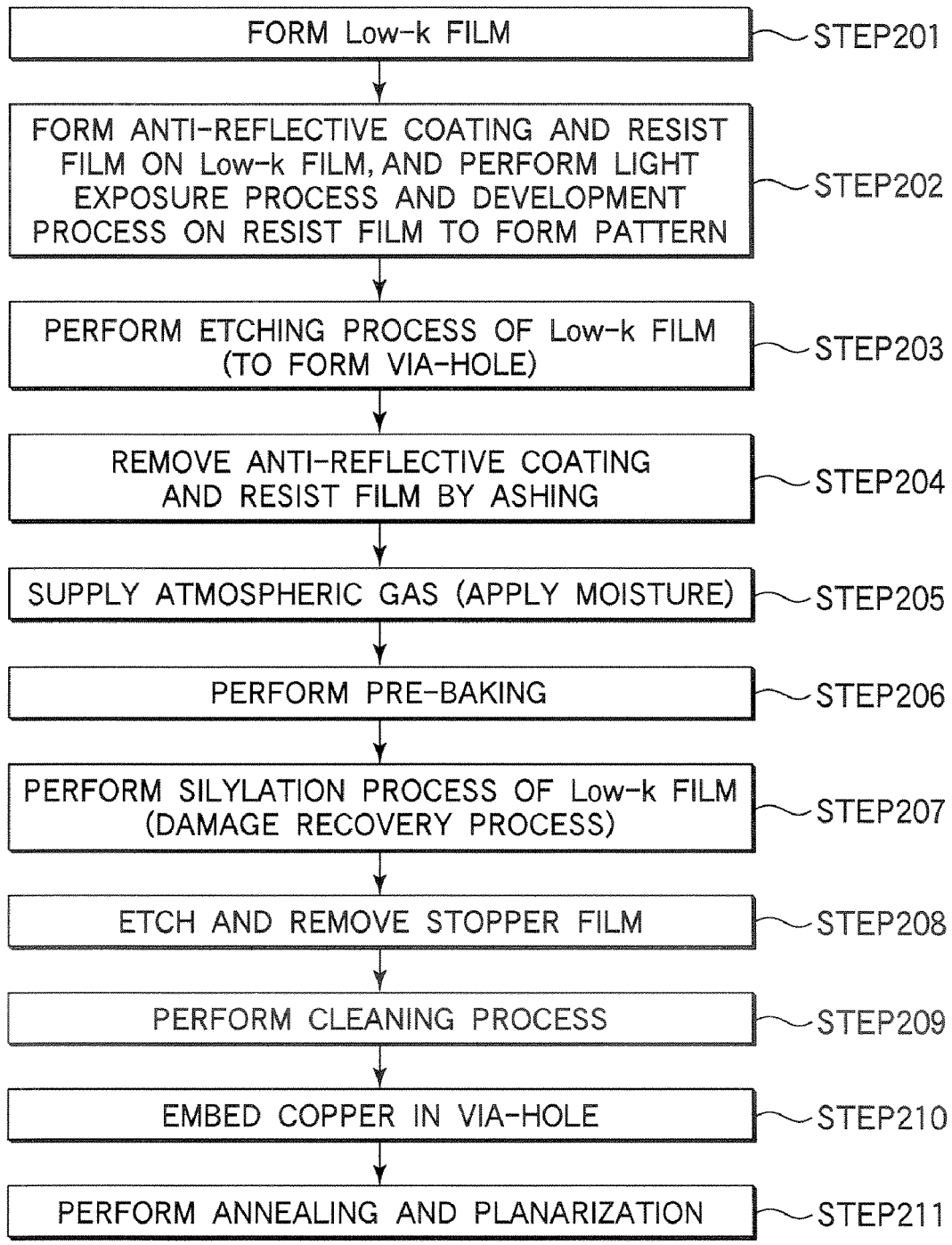
FIG. 19 is a flowchart showing a semiconductor device manufacturing process employing a single damascene method, performed by the semiconductor device manufacturing system shown in FIG. 15.

Next, an explanation will be given of a semiconductor device manufacturing process employing a single damascene method, performed by the semiconductor device manufacturing system shown in FIG. 15. FIG. 19 is a flowchart showing a manufacturing process of this kind. FIGS. 20A to 20G are sectional views showing steps of the flow shown in FIG. 19. In this process, since the film structures in manufacturing a semiconductor device are the same as those shown in FIGS. 10A to 10K, the same films described above are denoted by the same reference numerals used in FIGS. 10A to 10K.

Figure 20A:
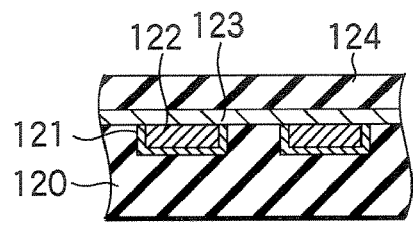
FIGS. 20A to 20G are sectional views showing steps of the flow shown in FIG. 19.

At first, a wafer W is prepared from an Si substrate (not shown) as follows. Specifically, an insulating film 120 is disposed on the substrate. A lower interconnection line 122 made of copper is disposed at an upper portion in the insulating film 120 with a barrier metal layer 121 interposed therebetween. A stopper film (such as an SiN film or SiC film) 123 is disposed on the insulating film 120 and lower interconnection line 122 made of copper. Then, the wafer W is transferred into the SOD apparatus 101, in which an inter-level insulating film (which will be referred to as a Low-k film, hereinafter) 124 made of a low dielectric constant material (Low-k material) is formed on the stopper film 123 (Step 201). Consequently, the state shown in FIG. 20A is obtained.

Figure 20B:
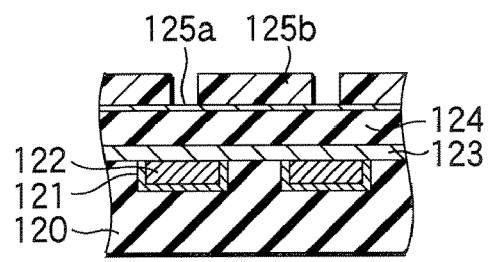

Then, the wafer W with the Low-k film 124 formed thereon is transferred into the resist coating/development apparatus 102, in which an anti-reflective coating 125a and a resist film 125b are sequentially formed on the Low-k film 124. Then, the wafer W is transferred into the light exposure apparatus 103, in which the wafer W is subjected to a light exposure process with a predetermined pattern. Then, the wafer W is transferred back into the resist coating/development apparatus 102, in which the resist film 125b is subjected to a development process by the developing unit to form a predetermined circuit pattern on the resist film 125b (Step 202). Consequently, the state shown in FIG. 20B is obtained.

Figure 20C:
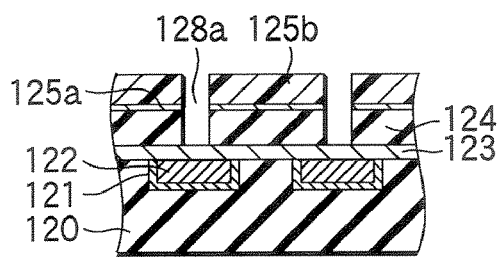

Then, the wafer W is transferred into the etching/ashing/recovering apparatus 108, in which etching, ashing, and a recovery process are sequentially performed as dry processes in a vacuum. Specifically, at first, the wafer W is transferred into the etching unit 151, in which plasma etching is performed (Step 203). Consequently, a via-hole 128a reaching the stopper film 123 is formed in the Low-k film 124 (FIG. 20C).

Figure 20D:
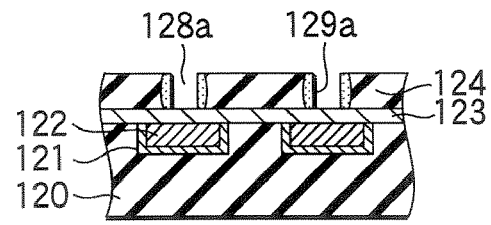

The wafer W thus treated by the etching process is transferred into the ashing unit 153, in which the anti-reflective coating 125a and resist film 125b are removed by a plasma ashing process (Step 204 and FIG. 20D).

When the anti-reflective coating 125a and resist film 125b are removed by plasma ashing, as described above, the sidewall of the via-hole 128a formed in the Low-k film 124 is damaged, so damaged portions 129a are formed, as shown in FIG. 20D, as in the first embodiment.

Accordingly, after the resist film and so forth are removed, in order to recover the damage of the Low-k film 124, the wafer W is transferred into the silylation unit (SCH) 154, in which a silylation process is performed. In this case, since the damage of the Low-k film 124 caused by the plasma ashing process is larger than the damage caused by the denaturing process using an ozone-containing gas described above, the recovery process needs to be performed more effectively. However, the etching/ashing/recovering apparatus 108 is arranged to sequentially perform the etching, ashing, recovery process in a vacuum atmosphere. Accordingly, moisture is scarcely present in the apparatus as it is, with which the silylation reaction is hardly caused, so the recovery process cannot be effectively performed.

Accordingly, in this embodiment, after the wafer W is transferred into the silylation unit (SCH) 154 and before the silylation process is performed, the valve 318 is opened to supply atmospheric gas through the atmospheric gas supply line 317, so as to apply moisture onto the wafer W (Step 205).

As described above, atmospheric gas is supplied to apply moisture onto the wafer W. In this respect, if the moisture amount remaining on the wafer W is too large when a silylation agent is supplied, the silylation agent may react with $H_2O$ and thereby generate particles that deteriorate the process. Accordingly, after atmospheric gas is supplied and before the silylation agent is supplied, a heating process (pre-baking) is performed to adjust the moisture amount (Step 206). At this time, if the pre-baking temperature is too high, the Low-k film damaged by the resist removal and so forth causes the dehydration condensation described above, which inhibits a silylation reaction when the silylation gas is supplied thereafter. Further, as described above, if the silylation agent (silylation gas) is supplied while the temperature of the wafer W is too high, the reaction proceeds only around the surface of the wafer W. On the other hand, where the wafer W is heated at a suitable temperature, the silylation agent enters fine pores of the Low-k film, which is particularly prominent in a porous Low-k film. Consequently, the silylation reaction takes place inside the film, and the damage recovery is thereby further promoted. In light of these factors, the pre-baking is preferably performed at a temperature of 50 to 200° C.

This pre-baking is preferably performed under reduced pressure or low humidity condition at the predetermined time. The pre-baking under above condition leads to higher effect.

Figure 20E:
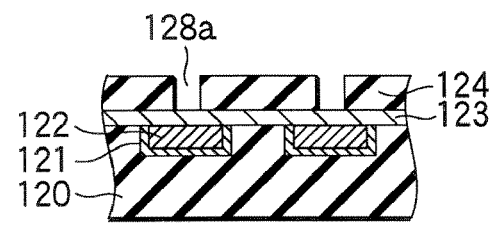

After the processes described above, the silylation agent is supplied to perform the silylation process (Step 207 and FIG. 20E). Where the silylation process is performed after the moisture on the wafer W is adjusted, the damage recovery of the Low-k film 124 is promoted. Accordingly, even where the resist film 125b and so forth are removed by a process causing a large damage, such as plasma ashing, the specific dielectric constant of the Low-k film 124 is returned to a state near the initial state.

Where the silylation process is performed in the silylation unit (SCH) 154, at first, the gate valve 319 is opened. Then, the wafer W is transferred into the chamber 301 and placed on the wafer table 302. Then, the pressure inside the chamber 301 is reduced to a predetermined pressure. In this state, the silylation agent vaporized by the vaporizer is carried by a carrier gas onto the wafer W. The conditions of the silylation process in the silylation unit (SCH) 154 are suitably selected in accordance with the type of the silylation agent (silylation gas), as follows. For example, the temperature of the vaporizer 312 is set to be from a room temperature to 200° C. The silylation agent flow rate is set to be 700 scam (mL/min) or less. The process pressure is set to be 10 mTorr to 100 Torr (1.33 to 13,330 Pa). The temperature of the table 302 is set to be from a room temperature to 200° C.

In order to promote the reaction, the wafer W is preferably heated by the heater 303 also after starting supply of the silylation agent. At this time, the wafer temperature is preferably set to be 50 to 200° C. to suitably bring out the effect of promoting the reaction.

Figure 21C:
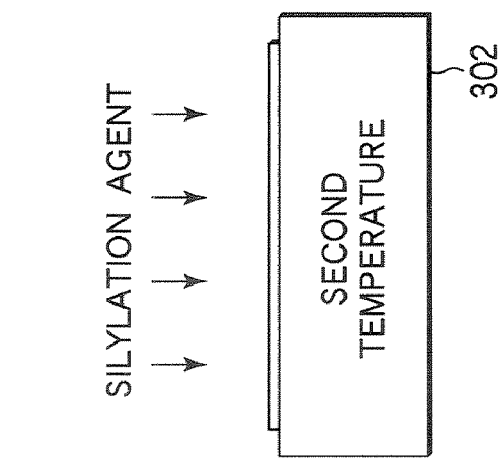
FIGS. 21A to 21C are views for explaining a method in which a silylation process is arranged to sequentially perform preheating and heating after starting supply of a silylation agent.
Figure 21B:
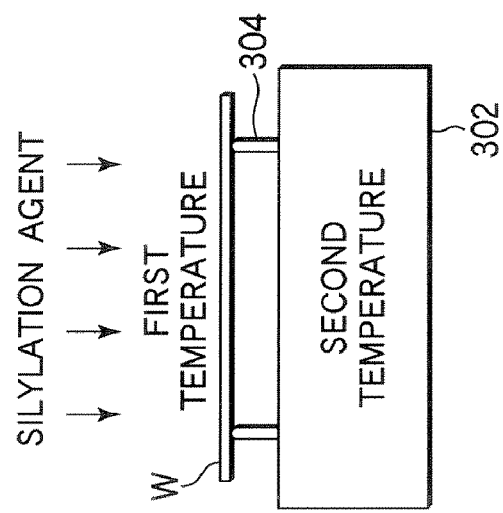
Figure 21A:
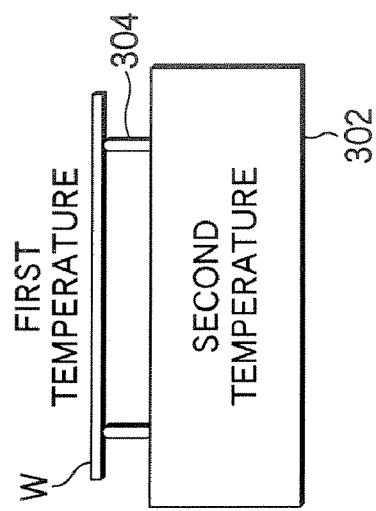

In this case, the heating temperature after starting supply of the silylation agent is preferably set to be higher than the heating temperature before starting supply of the silylation agent. In order to realize such a two-step heating, the following method may be used. Specifically, the wafer table 302 is heated in advance by the heater 303 to a second temperature corresponding to the temperature necessary after starting supply of the silylation agent. Then, the wafer W is supported by the lifter pins 304 set at a raised position, and is thereby separated from the wafer table 302, as shown in FIG. 21A, so that the wafer W is heated to a first temperature lower than the second temperature. In this state, as shown in FIG. 21B, the silylation agent starts being supplied. Then, as shown in FIG. 21C, the lifter pins 304 are moved down to place the wafer W on the wafer table 302, so that the wafer W is heated to the second temperature. Alternatively, the following method may be adopted, as described above. Specifically, the pre-baking is performed while the wafer is placed on a table and is heated to the first temperature by a lamp disposed as heating means. Then, after starting supply of the silylation agent, the output to the lamp is increased to heat the wafer to the second temperature.

Figure 20F:
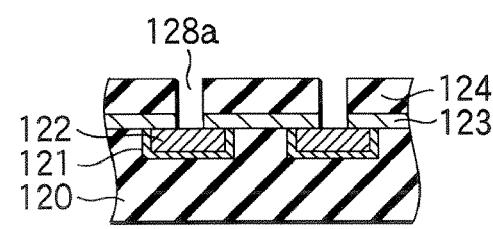
Figure 20G:
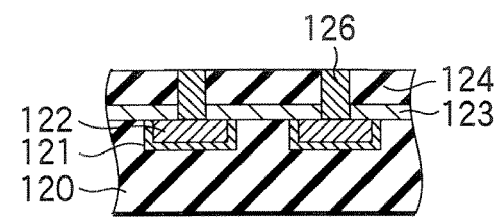

The wafer W thus treated by the silylation process is transferred into the etching unit 152, in which an etching process is performed to remove the stopper film 123 (Step 208 and FIG. 20F). Then, the wafer W is transferred into the cleaning apparatus 104', in which a cleaning process is performed (Step 209). The Low-k film 124 may be damaged by the etching process and/or cleaning process. In this case, a silylation process may be performed in the same manner as described above.

Thereafter, as in the first embodiment, the wafer W is transferred into the sputtering apparatus 106, in which a barrier metal film and a Cu seed layer are formed on the inner surface of the via-hole 128a. Then, the wafer W is transferred into the electrolytic plating apparatus 107, in which copper 126 used as an interconnection line metal is embedded in the via-hole 128a by electrolytic plating (Step 210 and FIG. 20G). Then, the wafer W is subjected to a heat process to perform an annealing process of the copper 126 embedded in the via-hole 128a (no annealing apparatus is shown in FIG. 15). Then, the wafer W is transferred into the CMP apparatus 109, in which a planarization process is performed on the wafer W by a CMP method (Step 211). Consequently, a predetermined semiconductor device is manufactured.

As described above, where a semiconductor device is manufactured, the recovery process is effectively performed. Accordingly, even where the resist film and so forth are removed by a process causing a large damage, such as an ashing process, the specific dielectric constant of the Low-k film is sufficiently recovered. Consequently, it is possible to provide a semiconductor device with excellent electrical characteristics, and to thereby improve the reliability of the semiconductor device. Incidentally, the procedures shown in FIGS. 19 and FIGS. 20A to 20G can be applied to a case where a semiconductor device manufacturing process employs a dual damascene method.

Next, an explanation will be given of results of experiments conducted to confirm effects of the second embodiment.

At first, samples were formed to have the structure shown in FIG. 14A. An unprocessed one of the samples was set as a reference (Sample 21). Another one of the samples was exposed to etching process conditions, and then to ashing conditions representing a resist film removing process (Sample 22). Another one of the samples was subjected to atmospheric gas supply and preheating, and then to a silylation process using a silylation agent supplied thereafter (Sample 23). Another one of the samples was further subjected to a heating process after starting supply of the silylation agent, subsequently to the preheating (Sample 24). Then, as shown in FIG. 14B described above, each of the samples thus prepared was provided with an Al-sputtering electrode 142, and the specific dielectric constant of the Low-k film 141 was measured while a voltage was applied between the Al-sputtering electrode 142 and Si substrate 140.

As the Low-k film, an SOD film was used. The etching process is performed using $CF_4$/Ar gas, and the ashing process is performed using $O_2$ gas. The preheating temperature was set at about 100° C., the heating temperature after starting supply of the silylation agent was set at 150° C.

Table 3 shows results of this experiment. As shown in Table 3, where the Low-k film was exposed to the etching process and ashing process, the specific dielectric constant of the film was increased from that of the reference. In the case of Sample 23 where the recovery process was performed after the atmospheric gas supply and preheating, the specific dielectric constant was recovered by 50%. In the case of Sample 24 where the heating was performed after starting supply of the silylation agent, the specific dielectric constant was recovered by 80%.

TABLE 3

| Sample No. | Process conditions | Specific dielectric constant | Recovery rate (%) |
| --- | --- | --- | --- |
| 21 | After Low-k film formation | 2.40 | — |
| 22 | After ashing | 2.66 | — |
| 23 | Preheating + Silylation process | 2.53 | 50.0 |
| 24 | Preheating + Silylation process + Heating after starting gas supply | 2.45 | 80.8 |

In the second embodiment, the resist film is ashed and removed by the ashing process using $O_2$ gas plasma. Alternatively, the resist film may be removed mainly by oxygen radicals contained in plasma.

In an ordinary ashing process, oxygen ions contained in plasma are drawn by the second RF power supply 260 to promote ashing. In this case, the Low-k film is damaged by oxygen ions, and the surface of the Low-k film may be thereby changed to a dense structure. If the Low-k film is dense, a silylation agent for the damage recovery process cannot enter the inside of the Low-k film, so the damage recovery is limited to a certain degree.

On the other hand, even under the same process conditions, where no RF power is applied to the second RF power supply 260, the resist film is processed predominantly by oxygen radicals contained in plasma. Consequently, the Low-k film is less damaged by oxygen ions, so the surface structure of the Low-k film is prevented from becoming denser. On the other hand, since the Low-k film is not dense, the Low-k film is internally more influenced by oxygen radicals, and thus may be more damaged at a deeper side. However, the silylation agent can enter deeply inside the Low-k film, so the damage there can be recovered.

Table 4 shows results of an experiment in removing a resist film by oxygen radicals. As regards Table 4, Sample 31 was set as a reference. Sample 32 was prepared by subjecting the reference to an ashing process. The conditions of the ashing process were the same as those for Sample 21 shown in Table 3 except for no RF being applied to the second RF power supply 260. Sample 33 was prepared by performing a recovery process using a silylation agent after the ashing process. Sample 34 was prepared by performing a resist film removing process using oxygen radicals, a cleaning process, and the recovery process using the silylation agent, in this order.

As shown in Table 4, after the resist film was removed by oxygen radicals, the specific dielectric constant was increased. However, after the recovery process using the silylation agent was performed, the specific dielectric constant was greatly recovered. Further, where the resist film removing process, cleaning process, and recovery process using the silylation agent were performed in this order, the specific dielectric constant was recovered to a level essentially equal to that of Sample 31 used as a reference. This is thought to have been attained, because moisture necessary for the silylation reaction was supplied by the cleaning process, and the recovery process was thereby promoted. Further, a dense layer may have been formed in the surface of the Low-k film during the etching process, as in the ashing process, as described above. However, it is thought that this dense layer was removed by the cleaning process, and the recovery process was thereby promoted.

TABLE 4

| Sample No. | Process conditions | Specific dielectric constant | Recovery rate (%) |
|---|---|---|---|
| 31 | Reference | 2.45 | — |
| 32 | Resist film removal by oxygen radicals | 3.35 | — |
| 33 | Resist film removal by oxygen radicals + Silylation process | 2.69 | 74 |
| 34 | Resist film removal by oxygen radicals + Cleaning process + Silylation process | 2.54 | 97 |

Also in a case where the resist film is removed by oxygen radicals, the following procedures may be employed, as in the embodiment using $O_2$ gas plasma described above. Specifically, before the silylation process, atmospheric gas is supplied into the chamber 301, and then a pre-baking is performed to adjust moisture amount to promote the silylation reaction. Further, in order to promote the silylation reaction, the wafer may be heated also after starting supply of the silylation agent to a temperature higher than that of the pre-baking.

In the second embodiment, the apparatus shown in FIG. 16 as an ashing unit 153 may serve as an apparatus for performing two or all of the etching process, ashing process, and recovery process. Specifically, for example, where the process gas supply source 240 is arranged to supply an etching process gas and an ashing process gas, the etching process gas is first supplied to perform the etching process, and then is switched to the ashing process gas to perform the ashing process. Alternatively, where the process gas supply source 240 is arranged to supply an etching process gas, an ashing process gas, and a silylation agent, the etching process gas is first supplied to perform the etching process, then is switched to the ashing process gas to perform the ashing process, and then is switched to the silylation agent to perform the silylation process. However, where the silylation process is performed, it is necessary to dispose means for supplying moisture onto the wafer W.

In the etching/ashing/recovering apparatus 108, before the silylation process, atmospheric gas is supplied into the silylation unit (SCH) 154. Alternatively, atmospheric gas may be supplied into another unit, such as the wafer transfer chamber 155, to apply moisture onto the wafer. As means for supplying moisture, a substance other than atmospheric gas, such as refined water vapor, may be supplied.

The present invention is not limited to the embodiments described above, and it may be modified in various manners. For example, the recovery process is exemplified by the silylation process, but the recovery process may be performed using another recovery gas. The etching target film to which the present invention is applied is preferably a Low-k film, as described above, such as a porous MSQ (Porous methyl-hydrogen-SilsesQuioxane) formed by an SOD apparatus. Alternatively, for example, an SiOC-based film, which is an inorganic insulating film formed by CVD, may be used. This film can be prepared from a conventional $SiO_2$ film by introducing methyl groups ($—CH_3$) into Si—O bonds present on the film to mix Si—$CH_3$ bonds therewith. Black Diamond (Applied Materials Ltd.), Coral (Novellus Ltd.), and Aurora (ASM Ltd.) correspond to this type. Some of them are dense while others are porous (with a lot of pores). However, the etching target film is not limited to a Low-k film.

In the embodiments described above, the present invention is applied to a semiconductor device manufacturing process using a single damascene method or dual damascene method to form a copper interconnection line, but this is not limiting. The present invention may be applied to any semiconductor device manufacturing process which includes a step of removing an etching mask on an etching target film.

Furthermore, the present invention should be construed to encompass arrangements obtained by suitably combining some of the components of the embodiments described above or excluding some of the components of the embodiments described above, as long as they do not depart from the spirit or scope of the present invention.

What is claimed is:

1. A semiconductor device manufacturing method comprising:
   forming an etching mask having a predetermined circuit pattern on a surface of an etching target film disposed on a semiconductor substrate;
   then, etching the etching target film through the etching mask to form a groove or hole in the etching target film;
   then, removing the etching mask by denaturing the etching mask, by use of a process gas containing ozone and water vapor, to be soluble in a predetermined liquid comprising purified water or a chemical solution;
   then, dissolving the etching mask thus denatured by the predetermined liquid; and
   then, recovering damage of the etching target film caused before or in said removing the etching mask, while supplying a predetermined recovery gas,
   wherein said recovering damage comprises heating the semiconductor substrate at a first temperature without supplying a silylation gas onto the semiconductor substrate to remove moisture remaining on the semiconductor substrate and then supplying the silylation gas as the recovery gas onto the semiconductor substrate to recover the damage by a silylation process.

2. The manufacturing method according to claim 1, wherein the method further comprises cleaning the semiconductor substrate after said removing the etching mask and before said recovering damage.

3. The manufacturing method according to claim 1, wherein the silylation gas contains a compound including silazane bonds (Si—N) in molecules.

4. The manufacturing method according to claim 3, wherein the compound is selected from a group consisting of TMDS (1,1,3,3-Tetramethyldisilazane), TMSDMA (Dimethylaminotrimethylsilane), DMSDMA (Dimethylsilyldimethylamine), TMSPyrole (1-Trimethylsilylpyrole), BSTFA (N,O -Bis(trimethylsilyl)trifluoroacetamide), and BDMADMS (Bis(dimethylamino)dimethylsilane).

5. The manufacturing method according to claim 1, wherein the first temperature is a temperature of 50 to 200° C.

6. The manufacturing method according to claim 1, wherein said recovering damage comprises heating the semiconductor substrate at a second temperature higher than the first temperature while supplying the silylation gas.

7. The manufacturing method according to claim 6, wherein the second temperature is set to be 50 to 150° C. and higher than the first temperature.

8. A semiconductor device manufacturing method comprising:
   forming an etching mask having a predetermined circuit pattern on a surface of an etching target film disposed on a semiconductor substrate;
   then, etching the etching target film through the etching mask to form a groove or hole in the etching target film;
   then, removing the etching mask by denaturing the etching mask, by use of a process gas containing ozone and water vapor, to be soluble in a predetermined liquid comprising purified water or a chemical solution and then dissolving the etching mask thus denatured by the predetermined liquid;
   then, recovering damage of the etching target film caused before or in said removing the etching mask, while supplying a predetermined recovery gas,
   wherein said recovering damage comprises heating the semiconductor substrate at a first temperature of higher than 50° C. without supplying a silylation gas onto the semiconductor substrate to remove moisture remaining on the semiconductor substrate, and then heating the semiconductor substrate at a second temperature set to be 50 to 150° C. and higher than the first temperature while supplying the silylation gas as the recovery gas onto the semiconductor substrate to recover the damage by a silylation process.

9. The manufacturing method according to claim 8, wherein the method further comprises cleaning the semiconductor substrate after said removing the etching mask and before said recovering damage.

10. The manufacturing method according to claim 8, wherein the silylation gas contains a compound including silazane bonds (Si—N) in molecules.

11. The manufacturing method according to claim 8, wherein the compound is selected from a group consisting of TMDS (1,1,3,3-Tetramethyldisilazane), TMSDMA (Dimethylaminotrimethylsilane), DMSDMA (Dimethylsilyldimethylamine), TMSPyrole (1-Trimethylsilylpyrole), BSTFA (N,O -Bis(trimethylsilyl)trifluoroacetamide), and BDMADMS (Bis(dimethylamino)dimethylsilane).

* * * * *